United States Patent
Koto

(10) Patent No.: US 7,019,578 B2
(45) Date of Patent: Mar. 28, 2006

(54) INPUT CIRCUIT

(75) Inventor: Tomohiko Koto, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/750,911

(22) Filed: Jan. 5, 2004

(65) Prior Publication Data

US 2004/0135598 A1 Jul. 15, 2004

(30) Foreign Application Priority Data

Jan. 6, 2003 (JP) ............................. 2003-000552

(51) Int. Cl.
*H03L 5/00* (2006.01)

(52) U.S. Cl. ...................................... 327/333; 327/108

(58) Field of Classification Search ................ 327/333, 327/108, 379, 389, 391, 560, 563, 52, 53, 327/65, 66, 198, 309, 313, 314, 318–321; 326/68, 80, 81, 83; 330/51, 253, 257
See application file for complete search history.

(56) References Cited

U.S. PATENT DOCUMENTS 5,847,581 A * 12/1998 Allen ........................... 326/81

6,359,494 B1 * 3/2002 Kanda et al. ................ 327/333

FOREIGN PATENT DOCUMENTS

JP 2000-183723 6/2000

* cited by examiner

*Primary Examiner*—Long Nguyen
(74) *Attorney, Agent, or Firm*—Arent Fox PLLC

(57) ABSTRACT

An input circuit for preventing the application of a voltage exceeding a transistor withstand voltage when the input circuit is switched to a standby state. The input circuit includes a first differential amplification circuit powered by a first power supply to amplify a first input signal and generate a second input signal. A level shift circuit is powered by the first power supply to generate a shifted input signal from the second input signal. A second differential amplification circuit is powered by a second power supply to amplify the shifted input signal and generate an amplified signal. A current control circuit selectively switches the input circuit between activated and standby states. A first circuit charges or discharges the level shift circuit so that voltage of the shifted input signal is less than or equal to voltage of the second power supply when switched to the standby state.

28 Claims, 14 Drawing Sheets

INPUT CIRCUIT

CROSS-REFERENCE TO RELATED APPLICATIONS

This application is based upon and claims the benefit of priority from the prior Japanese Patent Application No. 2003-000552, filed on Jan. 6, 2003, the entire contents of which are incorporated herein by reference.

BACKGROUND OF THE INVENTION

The present invention relates to an input circuit, and more particularly, to an input circuit provided with a level shift function operated by an external power supply corresponding to an external interface and an internal power supply corresponding to an internal circuit to shift the voltage of an input circuit from an external device to a voltage adapted to the internal power supply.

Referring to FIG. 1, Japanese Laid-Open Patent Publication No. 2000-183723 describes a first prior art example of an input circuit 150. The input circuit 150 includes a first functional block configured by a first differential amplification circuit 151, a second functional block configured by a level shift circuit 152, and a third functional block configured by a second differential amplification circuit 153.

The first differential amplification circuit 151 and the level shift circuit 152 are connected between a first power supply V1 and a second power supply V2. The second differential amplification circuit 153 is connected between a third power supply V3 and a fourth power supply V4. The second and fourth power supplies V2 and V4 correspond to a ground power supply, the first power supply V1 corresponds to an external power supply, and the third power supply V3 corresponds to an internal power supply at which the potential is lower than that at the external power supply.

The first differential amplification circuit 151 includes resistors 154a and 154b, which are connected in parallel to the first power supply V1, nMOS Trs 155 and 156 having gates for respectively receiving first and second input signals INA and INB, which are external input signals, and a constant current source 157. The first differential amplification circuit 151 amplifies the potential difference of the first and second input signals INA and INB. The first and second input signals INA and INB are signals that complement each other or are differential signals generated so that one of the signals has a median potential relative to the voltage amplitude of the other one of the signals (constant voltage).

The level shift circuit 152 includes an nMOS Tr 158 and a constant current source 159. The level shift circuit 152 shifts the output voltage of the first differential amplification circuit 151 that is provided to the gate of the nMOS Tr 158 to a voltage adapted to the third power supply V3 (internal power supply).

The second differential amplification circuit 153 includes a positive input terminal for receiving the output signal of the level shift circuit 152 and a negative input terminal for receiving a constant voltage signal having a median potential relative to the voltage amplitude of the input signal. The second differential amplification circuit 153 amplifies the potential difference of the two input signals.

FIG. 2 is a waveform diagram of the input circuit 150 in an activated state.

The first power supply V1 is set at 2.5 V, the second power supply V2 is set at 0.0 V, the third power supply V3 is set at 1.2 V, the fourth power supply V4 is set at 0.0 V, and the voltage of the first functional block input signal (in FIG. 2, IN1) serving as an external input signal provided to the first differential amplification circuit 151 is set at 2.2 V/1.8 V.

The first differential amplification circuit 151 amplifies the potential difference of the first functional block input signal IN1 (0.4 V) to generate a second functional block input signal IN2. The voltage of the second functional block input signal IN2 varies within the range of about 0.5 V to 2.5 V in accordance with factors such as the configuration of the first differential amplification circuit 151, the capacity of the devices in the first differential amplification circuit 151, the temperature conditions, and processing conditions.

The level shift circuit 152 shifts the voltage of the second functional block input signal IN2 to a voltage adapted to the third power supply V3 and in the range of 0.0 V to 1.2 V to generate the third functional block input signal IN3.

In this manner, the level shift circuit 152 arranged between the first differential amplification circuit 151 and the second differential amplification circuit 153 prevents a voltage greater than or equal to that of the third power supply V3 (1.2 V) from being applied to the second differential amplification circuit 153. This is because the transistor configuration of the second differential amplification circuit 153 activated by the internal power supply differs from the transistor configuration of the first differential amplification circuit 151 and the level shift circuit 152 activated by the external power supply. For example, the gate oxidized film of the transistor in the second differential amplification circuit 153 is thinner than that of the first differential amplification circuit 151 and the level shift circuit 152. In other words, the withstand voltage of the devices in the second differential amplification circuit 153 is lower than that of the first differential amplification circuit 151 and the level shift circuit 152. Thus, the application of a high voltage exceeding the gate withstand voltage of the transistor (in this case, the first power supply V1) to the second differential amplification circuit 153 damages the devices and causes erroneous operation of the input circuit 150.

Recent progress in manufacturing process technology has miniaturized the transistors of internal circuits. This has lowered the voltages of internal power supplies at a high speed. In contrast, external power supplies rely on external factors, such as external interfaces. Thus, the voltages for the external power supplies have not been lowered as quick as that of the internal power supplies. This has further increased the potential difference between the external power supply and the internal power supply. Therefore, the input circuit must shift the output voltage of the first differential amplification circuit 151 to a voltage that the second differential amplification circuit 153, which is activated by an internal power supply having a lower voltage, is capable of receiving.

The input circuit 150 must not apply a high voltage exceeding the transistor gate withstand voltage to the second differential amplification circuit 153 regardless of whether the input circuit 150 is in an activated state, a standby state, or switched from the activated state to the standby state. In the standby state, the input circuit 150 is disconnected from, for example, the constant current sources 157 and 159 of the input circuit 150 to reduce the current consumption of the input circuit 150.

FIG. 3 is a waveform diagram showing the operation of the input circuit 150 when switching between the activated and standby states. The voltages of the first to fourth power supplies V1 to V4 and the first functional block input signal IN1 (external input signal) are the same as those in FIG. 2.

At time t1, the constant current sources 157 and 159 are disconnected (controlled at current value 0) to switch the input circuit 150 to the standby state. This increases the voltage of the second function block input signal IN2 (output voltage of the first differential amplification circuit 151) to a value close to that of the first power supply V1 (2.5 V). This activates the nMOS Tr 158 of the level shift circuit 152 and increases the voltage of the third function block input signal IN3 (the output voltage of the level shift circuit 152) to a value close to the first power supply V1 (2.5V). Accordingly, the first prior art example has a shortcoming in that a voltage exceeding that of the internal power supply (1.2 V), or the gate withstand voltage, is applied to the second differential amplification circuit 153 when switching from the activated state to the standby state.

To solve this problem, a second prior art example of an input circuit 160 such as that shown in FIG. 4 has been proposed.

The input circuit 160 differs from the first prior art example in the configuration of the first differential amplification circuit. A first differential amplification circuit 161 includes pMOS Trs 162 and 163 having gates for respectively receiving first and second input signals INA and INB, nMOS Trs 164 and 165 that configure a current mirror circuit, and a constant current source 166. The constant current source 166 is connected between a first power supply V1 and the sources of the pMOS Trs 162 and 163.

The first differential amplification circuit 161 amplifies the potential difference of the first and second input signals INA and INB. The first differential amplification circuit 161 is optimal for amplifying an input signal that is close to the ground potential.

FIG. 5 is a waveform diagram showing the operation of the input circuit 160 when switching between the activated and standby states. The voltages of the first to fourth power supplies V1 to V4 are the same as those in FIG. 2, and the voltage of the first functional block input signal IN1 (external input signal) is set at 1.7 V/1.3 V.

At time t1, the constant current sources 166 and 159 are disconnected to switch the input circuit 160 to the standby state. This decreases the voltage of the second function block input signal IN2 (output voltage of the first differential amplification circuit 161) to a value close to that of the second power supply V2 (0.0 V). In response to the voltage decrease, the nMOS Tr 158 of the level shift circuit 152 is inactivated. By decreasing the voltage of the input signal IN2 in this manner, the voltage of the input signal IN3 is prevented from being increased.

However, the gate potential at the nMOS Tr 158 does not decrease to a value less than or equal to a threshold value that immediately inactivates the nMOS Tr 158. The nMOS Tr 158 is inactivated when the output voltage of the first differential amplification circuit 161 (the node voltage between the pMOS Tr 163 and the nMOS Tr 165) is decreased to the ground potential. Thus, the voltage of the third functional block input signal IN3 (the output voltage of the level shift circuit 152) is temporarily increased to a value near that of the first power supply V1 (2.5 V) in a transitional state during period ΔT from when the constant current source 159 is disconnected to when the nMOS Tr 158 is inactivated. As a result, a voltage exceeding that of the third power supply V3 (1.2V) is applied to the second differential amplification circuit 153.

To avoid such temporary voltage increase, for example, the time for disconnecting the constant current source 159 of the second functional block (the current value being decreased to 0) may be changed. For example, timings may be adjusted so that the period ΔT required for inactivating the nMOS Tr 158 in FIG. 5 becomes 0 while intentionally delaying the time at which the current value of the constant current source 159 decreases to 0. This prevents a voltage exceeding the gate withstand voltage from being applied to the second differential amplification circuit 153.

However, the timing adjustment decreases the speed for switching from the activated state to the standby state and also the speed for returning from the standby state again to the activated state. This is not desirable when performing high speed operations. The problems of the first and second prior art examples also occur when the supplied power is negative potential power. An example of such a case will now be discussed.

FIG. 6 is a circuit diagram of a third prior art example of an input circuit 170.

The first to fourth power supplies V11 to V14 are connected to the input circuit 170. The first and third power supplies V11 and V13 are negative potential power supplies, and the second and fourth power supplies V12 and V14 are ground power supplies. The absolute value of the potential at the third power supply V13 is lower than that at the first power supply V11 (|first power supply—second power supply|>|third power supply—fourth power supply|).

The input circuit 170 includes a first differential amplification circuit 171, a level shift circuit 172, and a second differential amplification circuit 173.

The first differential amplification circuit 171 includes resistors 174 and 175, nMOS Trs 176 and 177 having gates for respectively receiving the first and second input signals INA and INB, and a constant current source 178 (nMOS Tr).

The resistor 174 is connected between the second power supply V12 (ground power supply) and the drain of the nMOS Tr 176. The resistor 175 is connected between the second power supply V12 and the nMOS Tr 177. The sources of the nMOS Trs 176 and 177 are connected to the first power supply V11 (negative power supply) via the constant current source 178. The gate of the nMOS Tr configuring the constant current source 178 is provided with a current control signal S1 that controls the activation and inactivation of the transistor.

The level shift circuit 172 includes a pMOS Tr 179 and a constant current source 180 (pMOS Tr). The output voltage of the first differential amplification circuit 171 is applied to the gate of the pMOS Tr 179. The gate of the pMOS Tr configuring the constant current source 180 is provided with a current control signal /S1 (the signals S1 and /S1 are signals that complement each other) that controls the activation and inactivation of the pMOS Tr.

FIG. 7 is a waveform diagram showing the operation of the input circuit 170 when switching between the activated and standby states. The voltages are set so that, for example, the first power supply V11 is −3.3 V, the second power supply V12 is 0.0 V, the third power supply V13 is −1.2 V, the fourth power supply V14 is 0.0 V, and the external input signal (the first functional block input signal IN1 in FIG. 7) is −2.0 V /−2.4 V.

At time t1, the current control signal S1 is low (the current control signal /S1 being high). This disconnects the constant current sources 178 and 180. When the input circuit 170 enters the standby state, the voltage of the second functional block input signal IN2 (the output voltage of the first differential amplification circuit 171) is increased to a value that is close to that of the second power supply V12 (ground potential 0.0 V). This inactivates the pMOS Tr 179 of the level shift circuit 172.

However, the voltage of the third functional block input signal IN3 (the output voltage of the level shift circuit 172) is temporarily decreased to a value near that of the first power supply V11 (−3.3 V) in a transitional state during period ΔT from when the constant current source 180 is disconnected to when the pMOS Tr 179 is inactivated. As a result, a high voltage (in this case, absolute value) exceeding that of the third power supply V13 (−1.2V) is applied to the second differential amplification circuit 173. To avoid such temporary voltage increase, timings may be adjusted so that the period ΔT required for inactivating the pMOS Tr 179 in FIG. 7 becomes 0 while intentionally delaying the time at which the pMOS Tr configuring the constant current source 180 is inactivated. This would not satisfy the afore-mentioned demand for increasing the speed of the input circuit.

SUMMARY OF THE INVENTION

One aspect of the present invention is an input circuit for receiving a first input signal and for use with a first power supply and a second power supply that supplies a voltage of absolute value less than the first power supply. The input circuit includes a first differential amplification circuit powered by the first power supply to receive and amplify the first input signal and generate a second input signal. A level shift circuit is powered by the first power supply to shift voltage of the second input signal and generate a shifted input signal. The level shift circuit includes an output terminal. A second differential amplification circuit is powered by the second power supply to amplify the shifted input signal and generate an amplified signal. A current control circuit is connected between the first power supply and the first differential amplification circuit to selectively switch the input circuit between an activated state and a standby state. A first circuit charges or discharges voltage at the output terminal of the level shift circuit so that voltage of the shifted input signal is less than or equal to voltage of the second power supply when switched to the standby state.

A further aspect of the present invention is an input circuit for receiving a first functional block input signal and for use with first, second, third, and fourth power supplies. The second power supply supplies a voltage of absolute value less than the first power supply, and the fourth power supply supplies a voltage of absolute value less than the third power supply. The input circuit has a first functional block including a first differential amplification circuit powered by the first power supply and the second power supply. The first differential amplification circuit receiving and amplifying the first functional block input signal to generate a second functional block input signal. A second functional block includes a level shift circuit powered by the first power supply and the second power supply to shift voltage of the second functional block input signal and generate a third functional block input signal. The level shift circuit includes an output terminal. A third functional block includes a second differential amplification circuit powered by the third power supply and the fourth power supply. The second differential amplification circuit amplifies the third functional block input signal to generate an amplified signal. A first current control circuit is connected between the first power supply and the first differential amplification circuit to selectively switch the input circuit between an activated state and a standby state. A first circuit charges or discharges voltage at the output terminal of the level shift circuit so that voltage of the third functional block signal is converged to a voltage between that of the third power supply and that of the fourth power supply.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
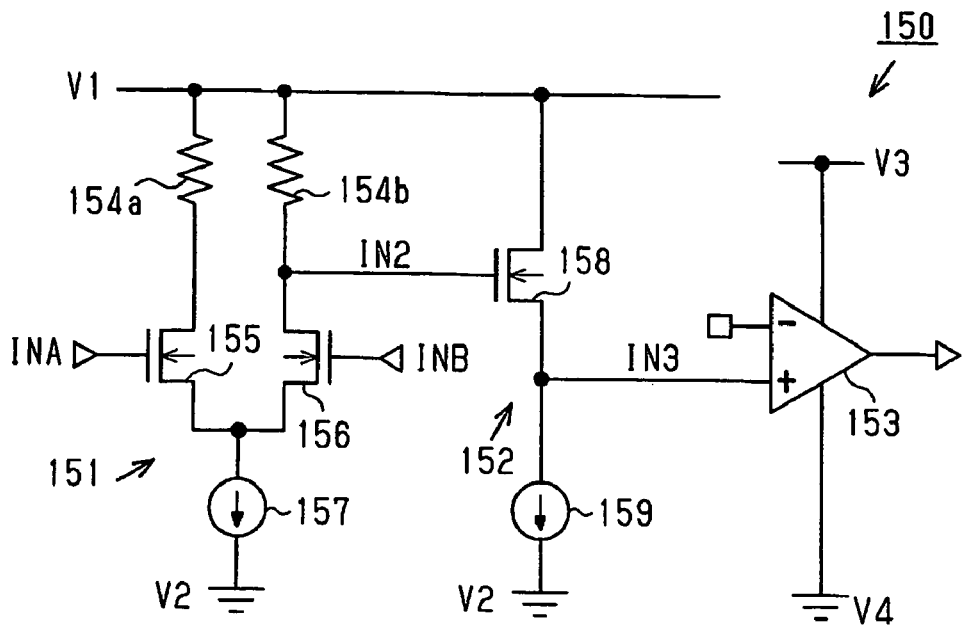
FIG. 1 is a circuit diagram of a first prior art input circuit.

In the drawings, like numerals are used for like elements throughout.

Figure 8:
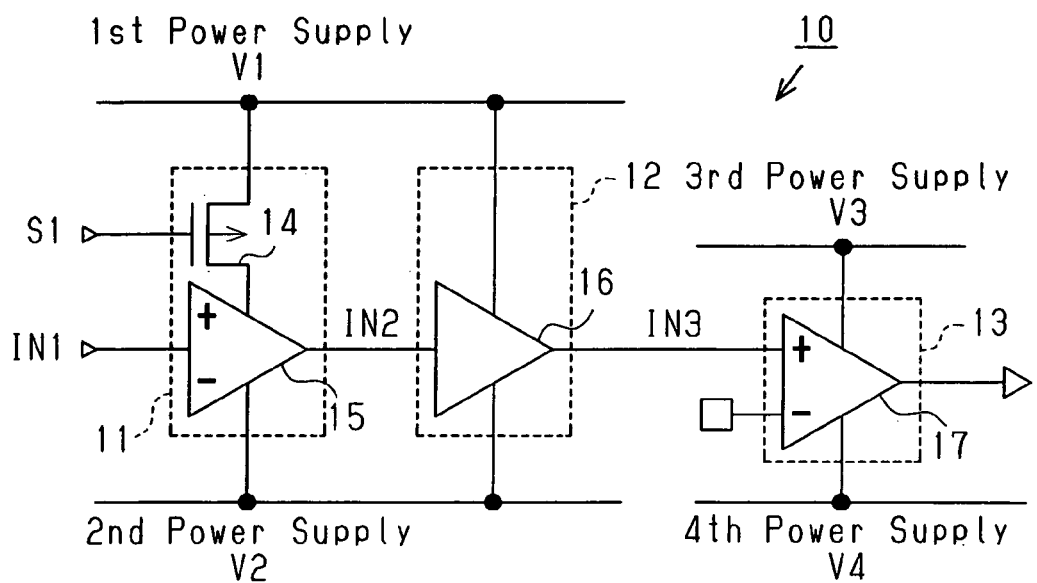
FIG. 8 is a circuit diagram showing the principles of an input circuit according to a first embodiment of the present invention.

FIG. 8 is a circuit diagram showing the principles of an input circuit 10 according to a first embodiment of the present invention. The input circuit 10 is connected to first to fourth power supplies V1 to V4. In the first embodiment, the second and fourth power supplies V2 and V4 are ground power supplies, and the first and third power supplied V1 and V3 are power supplies having positive potentials. The first power supply V1 corresponds to an external power supply, and the third power supply V3 corresponds to an internal power supply at which the potential is lower than that at the external power supply.

The input circuit 10 includes first and second functional blocks 11 and 12, which are connected between the first power supply V1 and the second power supply V2, and a third functional block 13, which is connected between the third power supply V3 and the fourth power supply V4.

The first functional block 11 includes a p-channel MOS transistor (hereafter referred to as pMOS Tr) 14, which functions as a first current control circuit, and a first differential amplification circuit 15. The first differential amplification circuit 15 amplifies the potential difference in an external input signal (first functional block input signal) IN1 to generate a second functional block input signal IN2.

The second functional block 12 includes a level shift circuit 16. The level shift circuit 16 shifts the voltage of the second functional block input signal IN2 to a voltage adapted to the third power supply V3 (internal power supply) to generate a third functional block input signal IN3.

The third functional block 13 includes a second differential amplification circuit 17. The second differential amplification circuit 17 amplifies the potential difference in a third functional block input signal IN3 and provides the amplified signal to an internal circuit (not shown).

Figure 9:
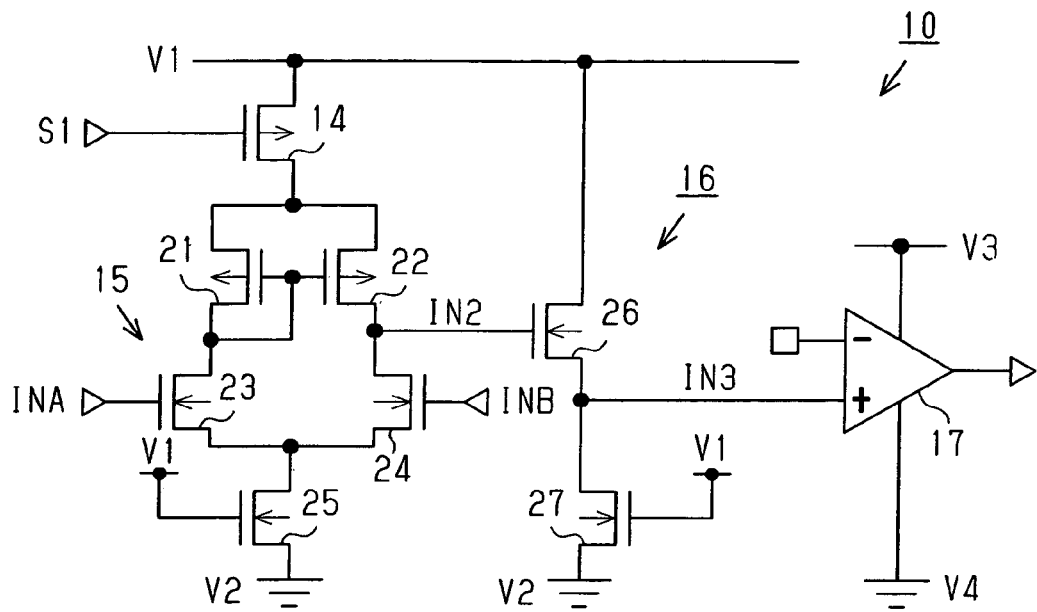
FIG. 9 is a schematic circuit diagram of the input circuit of the first embodiment.

FIG. 9 is a circuit diagram showing the input circuit 10 in detail.

The first differential amplification circuit 15 includes pMOS Trs 21 and 22, which configure a current mirror circuit functioning as a first load circuit, n-channel MOS transistors (hereafter referred to as nMOS Trs) 23 and 24, which are respectively connected in series to the pMOS Trs 21 and 22, and an nMOS Tr 25, which functions as a first current source.

The pMOS Tr 14 has a source connected to the first power supply V1 and a drain connected to the sources of the pMOS Trs 21 and 22. The gate of the pMOS Tr 14 is provided with a current control signal S1, which controls the activation and inactivation of the pMOS Tr14.

The gates of the pMOS Trs 21 and 22 are connected to each other and to the drain of the pMOS Tr 21. The drains of the pMOS Trs 21 and 22 are respectively connected to the drains of the nMOS Trs 23 and 24.

The sources of the nMOS Trs 23 and 24 are connected to the drain of the nMOS Tr 25, and the source of the nMOS Tr 25 is connected to the second power supply V2. The gate of the nMOS Tr 25 is supplied with voltage of the first power supply V1 that is greater than or equal to the threshold value of the nMOS Tr 25 (voltage enabling activation of an nMOS Tr 27). The first and second input signals INA and INB, which function as the first functional block input signal IN1 (external input signal), are applied to the gates of the nMOS Trs 23 and 24. In the first embodiment, the first and second input signals INA and INB complement each other. When a current control signal S1 activates the pMOS Tr 14, the first differential amplification circuit 15 amplifies the potential difference of the first and second input signals INA and INB to generate a second functional block input signal IN2.

The level shift circuit 16 includes an nMOS Tr 26, which functions as a level shift transistor, and an nMOS Tr 27, which functions as a second current source.

The drain of the nMOS Tr 26 is connected to the first power supply V1. The second functional block input signal IN2 is applied to the gate of the nMOS Tr 26. The source of the nMOS Tr 26 is connected to the drain of the nMOS Tr 27, and the source of the nMOS Tr27 is connected to the second power supply V2. The gate of the nMOS Tr 27 is supplied with voltage of the first power supply V1 that is greater than or equal to the threshold value of the nMOS Tr 27 (voltage enabling activation of the nMOS Tr 27). The level shift circuit 16 shifts the voltage of the second functional block input signal IN2 to a voltage in the range between the voltages of the third power supply V3 and the fourth power supply V4 (ground power supply) to generate the third functional block input signal IN3. In other words, the nMOS Trs 26 and 27 of the level shift circuit 16 are designed to shift the voltage of the second functional block input signal IN2 to a voltage adapted to the third power supply V3.

The second differential amplification circuit 17, which is configured in the same manner as the first differential amplification circuit 15, amplifies the potential difference in the third functional block input signal IN3 and provides the amplified signal to an internal circuit. In the first embodiment, the output signal of the level shift circuit 16 is provided to the positive input terminal of the second differential amplification circuit 17. Further, a constant voltage signal having a median potential of the voltage amplitude of the output signal is provided to the negative input terminal of the second differential amplification circuit 17.

The third power supply V3 supplies the second differential amplification circuit 17 with voltage lower than that of the first power supply V1. Thus, the gate oxidized film of the transistor in the second differential amplification circuit 17 is thinner than the gate oxidized film of the transistor in the first differential amplification circuit 15 or the level shift circuit 16. In other words, the transistor in the second differential amplification circuit 17 has a gate oxidized film with a thickness corresponding to the voltage of the third power supply V3. Thus, the transistor in the second differential amplification circuit 17 has a gate withstand voltage that is lower than that of the transistors in the first differential amplification circuit 15 and the level shift circuit 16.

When the current control signal S1 goes low and activates the pMOS Tr 14 of the first functional block 11 (refer to FIG. 8), the input circuit 10 is activated. In the first embodiment, the operation of the input circuit 10 in an activated state is the same as the operation of the prior art input circuit 150

Figure 2:
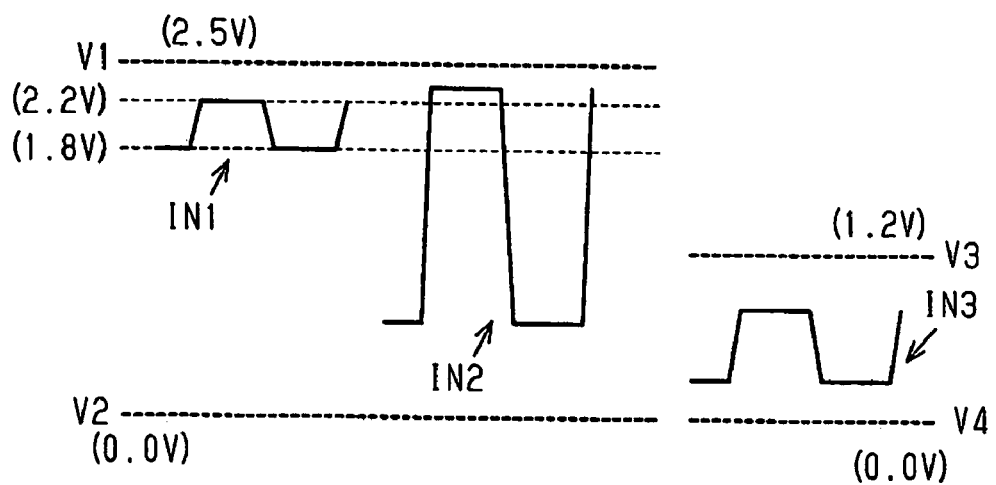
FIG. 2 is a waveform diagram showing the input circuit of FIG. 1 in an activated state.
Figure 3:
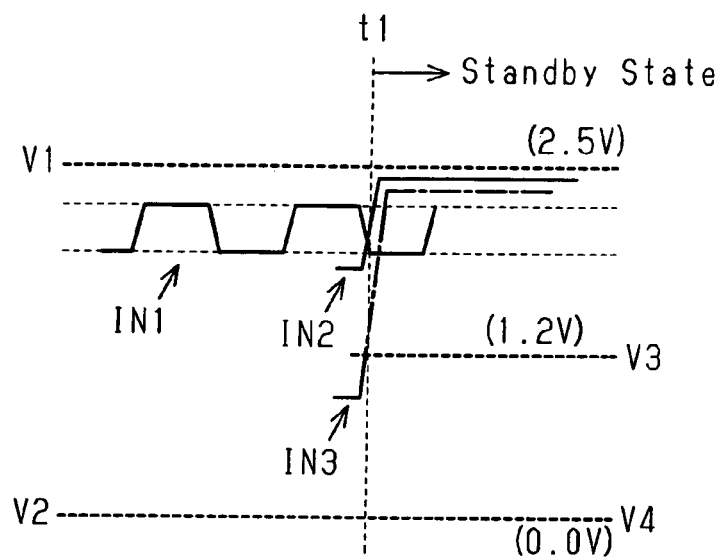
FIG. 3 is a waveform diagram showing the operation of the input circuit of FIG. 1 when switching between an activated state and a standby state.
Figure 4:
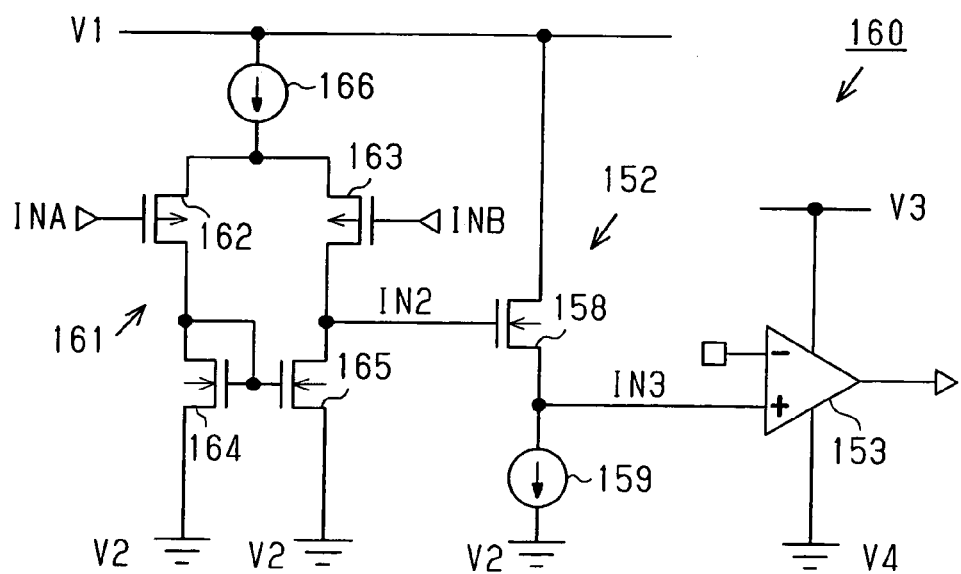
FIG. 4 is a circuit diagram of a second prior art input circuit.
Figure 5:
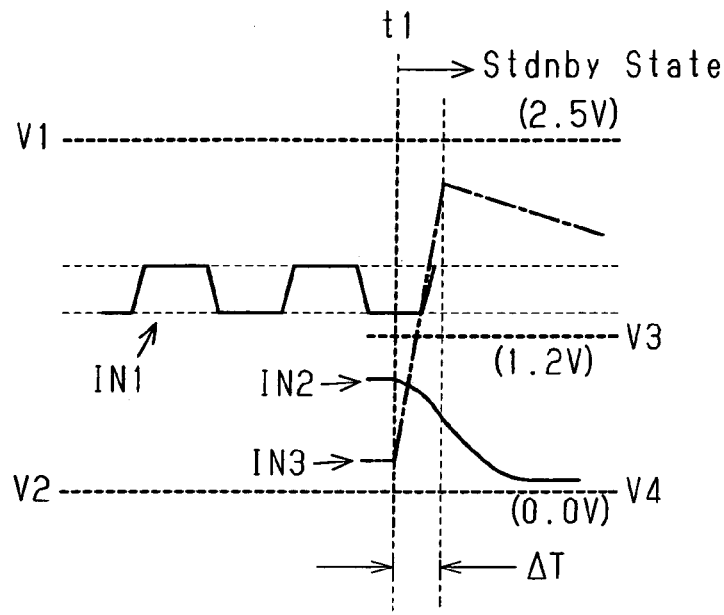
FIG. 5 is a waveform diagram showing the operation of the input circuit of FIG. 4 when switching between an activated state and a standby state.
Figure 6:
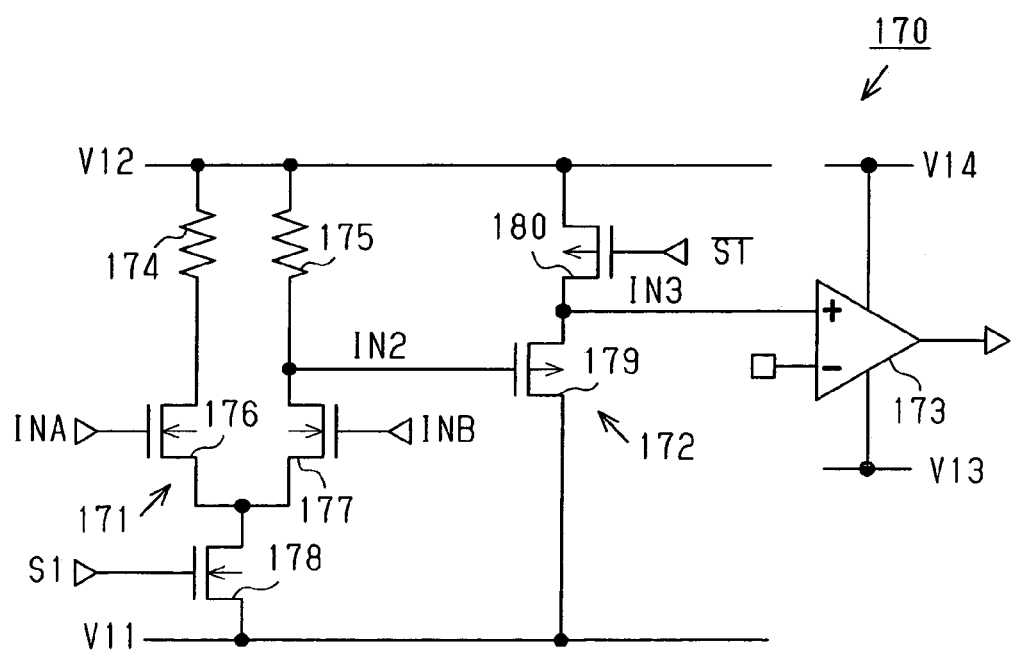
FIG. 6 is a circuit diagram of a third prior art input circuit.
Figure 7:
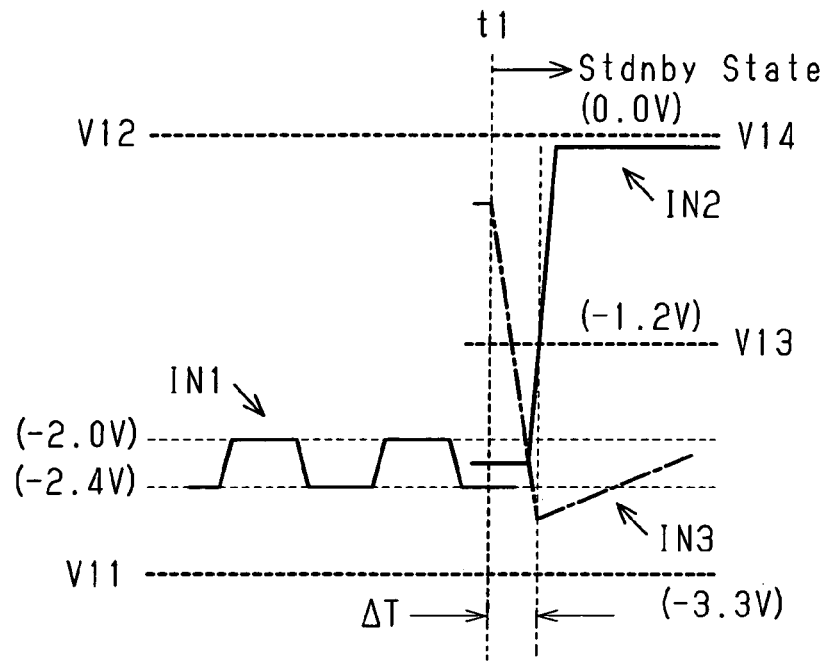
FIG. 7 is a waveform diagram showing the operation of the input circuit of FIG. 6 when switching between an activated state and a standby state.

(FIG. 2) in an activated state. Thus, the operation of the input circuit 10 in the activated state will not be discussed in detail.

The operation of the input circuit 10 when switched from an activated state to a standby state will now be discussed.

When the current control signal S1 goes high and inactivates the pMOS Tr 14, the input circuit 10 enters a standby state (i.e., the value of the current flowing through the pMOS Tr 14 being 0).

Figure 10:
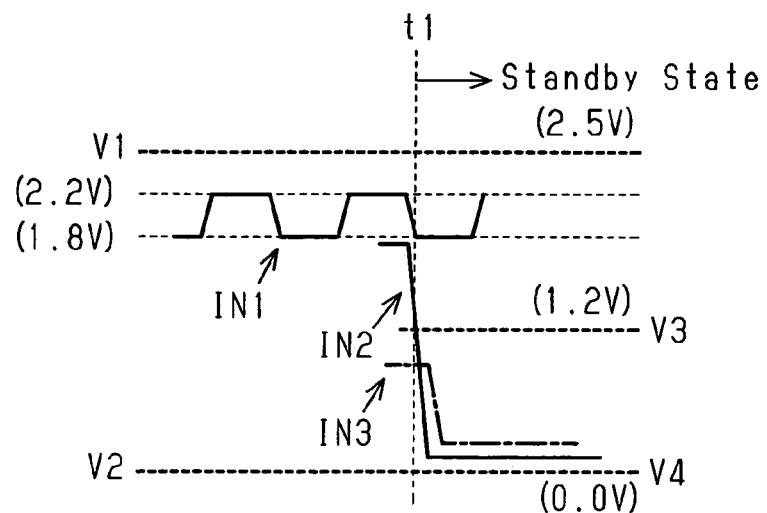
FIG. 10 is a waveform diagram showing the operation of the input circuit of FIG. 9 when switching between an activated state and a standby state.

FIG. 10 is a waveform diagram showing the operation of the input circuit 10 when switched between an activated state and a standby state. The first power supply V1 is set at 2.5 V, the second power supply V2 is set at 0.0 V, the third power supply V3 is set at 1.2 V, the fourth power supply V4 is set at 0.0 V, and the voltage of the first functional block input signal IN1 (external input signal) is set at 2.2 V/1.8 V.

At time t1, the current control signal S1 goes high and inactivates the pMOS Tr 14 to enter the standby state. This immediately decreases the output voltage of the first differential amplification circuit 15 (the node voltage between the pMOS Tr 22 and the nMOS Tr 24) to the ground potential due to the discharging via the nMOS Tr 24 and the nMOS Tr 25. Thus, the voltage of the second functional block input signal IN2 is quickly lowered to a value close to the voltage of the second power supply V2 (0.0 V). Accordingly, the nMOS Tr 26 of the level shift circuit 16 is immediately inactivated, and the output voltage of the level shift circuit 16 (node voltage between the nMOS Trs 26 and 27) is decreased to the ground potential by the discharging to the ground via the nMOS Tr 27, which functions as the second current source. Thus, the voltage of the third functional block input signal IN3 is quickly lowered to a value close to the voltage of the second power supply V2 (0.0 V). This prevents a voltage exceeding the transistor gate withstand voltage from being applied to the second differential amplification circuit 17 when switching to the standby state. In other words, the voltage of the first power supply V1 (2.5 V) exceeding that of the third power supply V3 (1.2 V) is not applied to the second differential amplification circuit 17.

The input circuit 10 of the first embodiment has the advantages described below.

(1) When the input circuit 10 is switched to the standby state, the output voltage of the first differential amplification circuit 15 is immediately decreased to the ground potential by the nMOS Tr25, and the nMOS Tr 26 of the level shift circuit 16 is immediately inactivated. The output voltage of the level shift circuit 16 is decreased to the ground potential by the nMOS Tr 27. Thus, the voltage of the third functional block input signal IN3 is quickly decreased to a value close to the voltage of the second power supply V2 (0.0 V). This prevents the voltage of the first power supply V1 exceeding the device withstand voltage from being applied to the second differential amplification circuit 17. Accordingly, the reliability of the input circuit 10 is improved.

(2) The gate of the nMOS Tr 25 (first current source) in the first differential amplification circuit 15 and the gate of the nMOS Tr 27 (second current source) in the level shift circuit 16 are connected to the first power supply V1. Accordingly, in the standby state, each current source is not disconnected (the nMOS Trs 25 and 27 are not inactivated). As a result, the output terminals of the first and second functional blocks 11 and 12 (the output terminals of the first differential amplification circuit 15 and the level shift circuit 16) do not enter a high impedance state (also referred to as a floating state).

(3) Regardless of whether the input circuit 10 is in an activated state, a standby state, or in a state switching between the activated and standby states, a voltage exceeding the gate withstand voltage is prevented from being supplied to the second differential amplification circuit 17.

(4) When the input circuit 10 is switched to the standby state, timings do not have to be adjusted so that high voltage is not applied to the second differential amplification circuit 17. In other words, the pMOS Tr 14 of the first functional block 11 is inactivated to immediately switch the input circuit 10 to a standby state. Accordingly, the switching to the standby state is performed at a high speed, and the return to the activated state thereafter is also performed at a high speed.

(5) The pMOS Tr14 of the first functional block 11 is inactivated to reduce the current consumed by the first and second functional blocks 11 and 12 in the standby state. Accordingly, the current consumption of the input circuit 10 in the standby state is reduced and power consumption is reduced.

Figure 11:
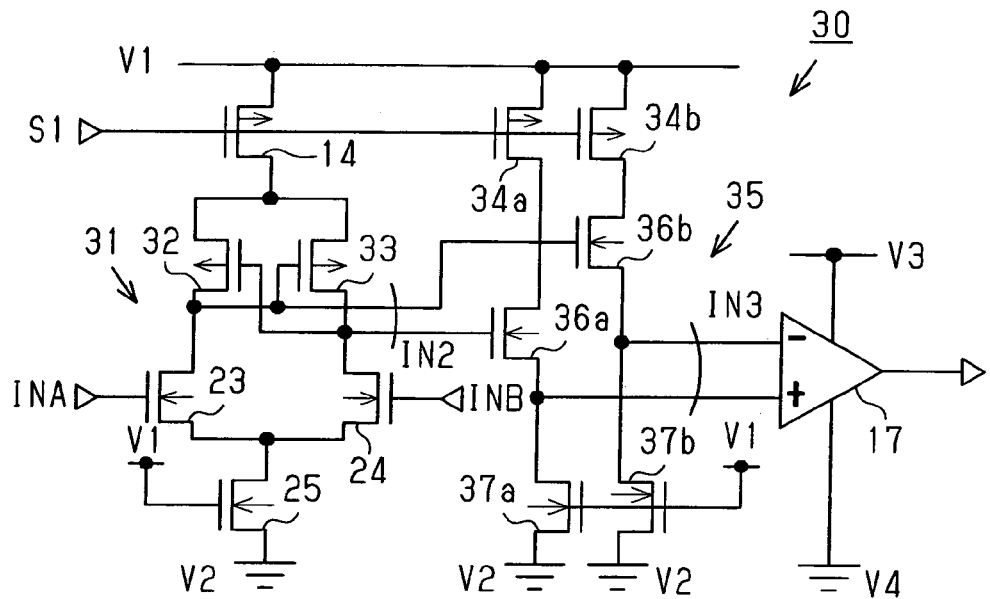
FIG. 11 is a schematic circuit diagram of an input circuit according to a second embodiment of the present invention.

FIG. 11 is a schematic circuit diagram of an input circuit 30 according to a second embodiment of the present invention. The configuration of the first and second functional blocks 11 and 12 (refer to FIG. 8) in the input circuit 10 of the first embodiment are changed in the input circuit 30.

The first functional block 11 includes a pMOS Tr 14 (first current control circuit) and a first differential amplification circuit 31. The first differential amplification circuit 31 includes pMOS Trs 32 and 33. The gates of the pMOS Trs 32 and 33 are connected to the drains of the other one of the pMOS Trs 32 and 33. That is, the pMOS Trs 21 and 22 in the current mirror circuit of the first differential amplification circuit 15 is changed to the pMOS Trs 32 and 33.

The first differential amplification circuit 31 amplifies the potential difference of the first and second input signals INA and INB to generate a signal at a node between the pMOS Tr 33 and the nMOS Tr24 and a complementary signal at a node between the pMOS Tr 32 and the nMOS Tr 23.

The second functional block 12 includes pMOS Trs 34a and 34b, which function as a second current control circuit, and a level shift circuit 35. The level shift circuit 35 includes nMOS Trs 36a and 36b (level shift transistors), which have gates supplied with the output voltage of the first differential amplification circuit 31 (the second functional block input signal IN2), and nMOS Trs 37a and 37b (second current source), which have gates connected to the first power supply V1.

More specifically, the node voltage between the pMOS Tr 33 and the nMOS Tr 24 is applied to the gate of the nMOS Tr 36a. Further, the node voltage between the pMOS Tr 32 and the nMOS Tr 23 is applied to the gate of the nMOS Tr 36b.

In the input circuit 30, complementary third functional block input signals IN3 signals are provided to the second differential amplification circuit 17. The input circuit 30 is activated when the current control signal S1 activates the pMOS Trs 14, 34a, and 34b and enters the standby state when the pMOS Trs 14, 34a, and 34b are inactivated. In the activated state, the level shift circuit 35 supplies the second differential amplification circuit 17 with the third functional block input signal IN3, the voltage of which has been shifted to adapt to the third power supply V3.

When switching the input circuit 30 from the activated state to the standby state, the output voltage of the level shift circuit 35 (the node voltage between the nMOS Trs 36a and 37a and the node voltage between the nMOS Trs 36b and 37b) are discharged to the second power supply V2 (ground potential 0.0V) through the nMOS Trs 37a and 37b. Thus, the voltage of the third functional block input signal IN3 is quickly decreased to a value close to the voltage of the second power supply V2 (ground potential) when the input circuit 30 is switched to the standby state (FIG. 10). Accordingly, the second embodiment has the same advantages as the first embodiment. In addition, in the second embodiment, the second functional block 12 includes the pMOS Trs 34a and 34b (second current control circuit). This decreases current leakage in the block 12 and further reduces power consumption.

A third embodiment of the present invention will now be discussed with reference to FIG. 12.

Figure 12:
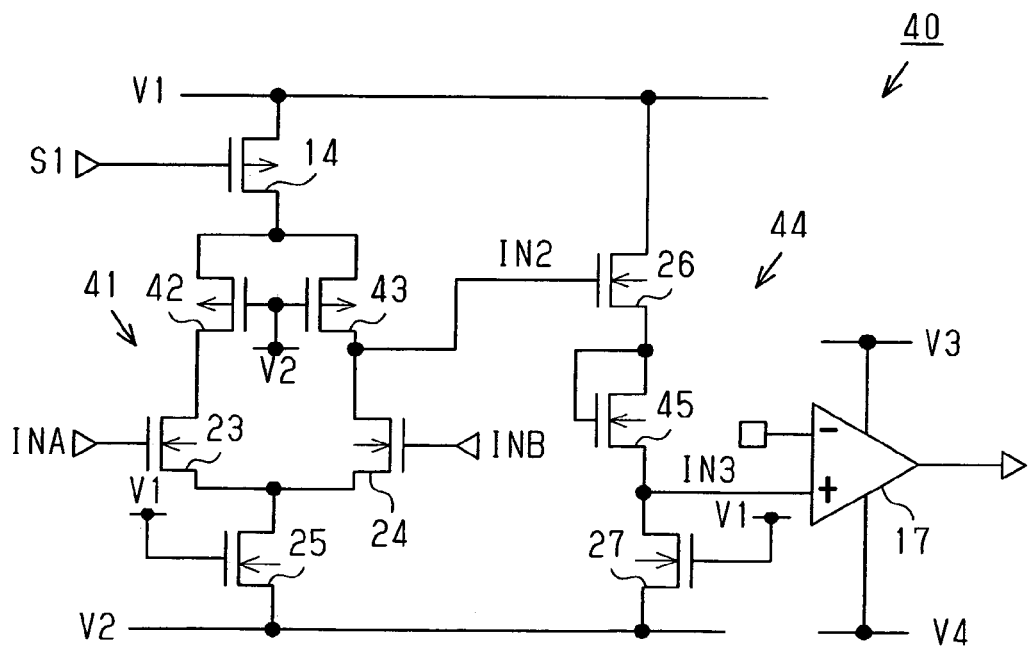
FIG. 12 is a schematic circuit diagram of an input circuit according to a third embodiment of the present invention.

FIG. 12 is a schematic circuit diagram of an input circuit 40 according to a third embodiment of the present invention. The configuration of the first and second functional blocks 11 and 12 in the input circuit of the first embodiment (refer to FIG. 8) is changed in the input circuit 40.

The first functional block 11 includes a pMOS Tr 14 (first current control circuit) and a first differential amplification circuit 41. The first differential amplification circuit 41 includes pMOS Trs 42 and 43. The second power supply V2 supplies the gates of the pMOS Trs 42 and 43 with voltage that is less than or equal to the threshold value.

The second functional block 12 includes a level shift circuit 44. The level shift circuit 44 includes nMOS Trs 26 and 27 and an nMOS Tr 45, which functions as a load circuit connected between the nMOS Trs 26 and 27. The nMOS Tr 45 has a diode connection configuration. More specifically, the nMOS Tr45, which functions as a transistor that adjusts the level shift amount, decreases the output voltage of the level shift circuit 44 by an amount equal to the threshold voltage of the nMOS Tr 45. Thus, in the third embodiment, the voltage of the third functional block input signal IN3 is shifted to a voltage that is lower than in the first and second embodiments (toward the voltage of the second power supply V2).

The level shift amount may also be adjusted by increasing the ON resistance of the nMOS Tr 26 (level shift transistor). However, this would decrease the operation speed of the level shift circuit 44 and is thus not appropriate for increasing the operation speed.

In addition to the advantages of the first embodiment, the third embodiment prevents voltage exceeding the voltage of the third power supply V3 from being applied to the second differential amplification circuit 17 (third functional block 13) without decreasing the operation speed in the activated state.

Figure 13:
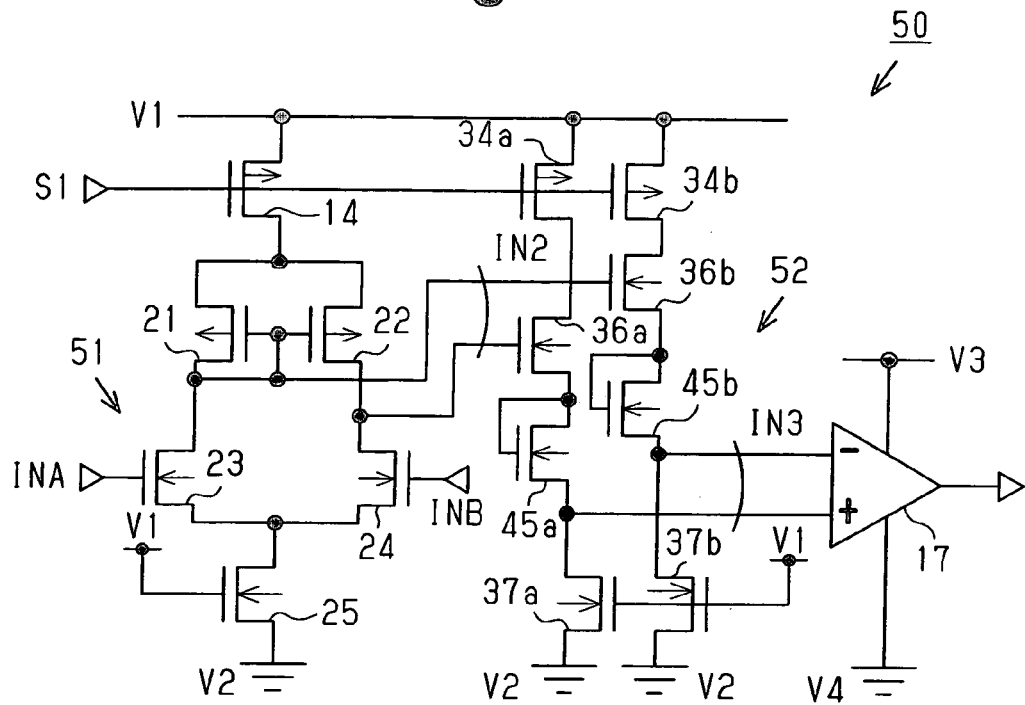
FIG. 13 is a schematic circuit diagram of an input circuit according to a fourth embodiment of the present invention.

FIG. 13 is a schematic circuit diagram of an input circuit 50 according to a fourth embodiment of the present invention. The input circuit 50 is configured by combining parts of the above embodiments.

The first functional block 11 includes a pMOS Tr 14. (first current control circuit) and a first differential amplification circuit 51.

The first differential amplification circuit 51 amplifies the potential difference of the first and second input signals INA and INB to generate a signal at a node between the pMOS Tr 22 and the nMOS Tr24 and a complementary signal at a node between the pMOS Tr 21 and the nMOS Tr 23.

The second functional block 12 includes pMOS Trs 34a and 34b (second current control circuit) and a level shift circuit 52.

The level shift circuit 52 is configured by adding nMOS Trs 45a and 45b (diode-connected transistors) as a second load circuit for adjusting the level shift amount, in the same manner as in the third embodiment, to the level shift circuit 35 of the second embodiment (refer to FIG. 11).

In the input circuit 50, the second differential amplification circuit 17 is provided with complementary third functional block input signals IN3. The input circuit 50 that is configured in such manner has the advantages of the above embodiments.

Figure 14:
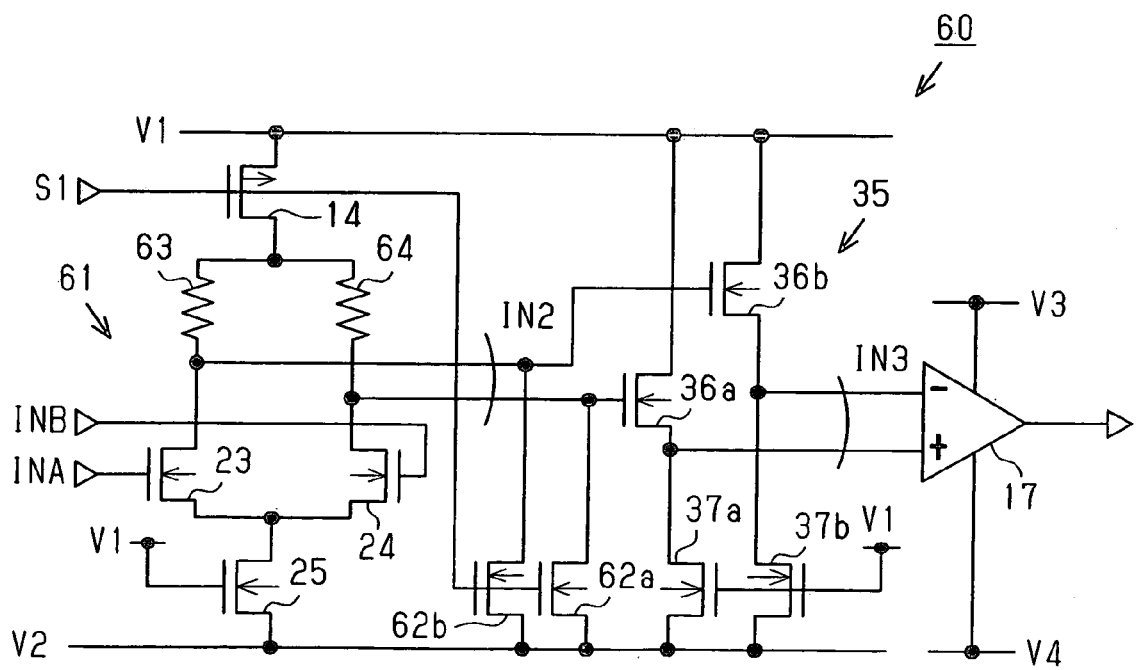
FIG. 14 is a schematic circuit diagram of an input circuit according to a fifth embodiment of the present invention.

FIG. 14 is a schematic circuit diagram of an input circuit 60 according to a fifth embodiment of the present invention. The input circuit 60 is configured by changing the configurations of the first and second functional blocks 11 and 12 in the input circuit 10 of the first embodiment (FIG. 8).

The first functional block 11 includes a pMOS TR 14 (first current control circuit), a first differential amplification circuit 61, and nMOS Trs 62a and 62b, which function as a third current control circuit.

The first differential amplification circuit 61 includes resistors 63 and 64. The resistors 63 and 64 replace the pMOS Trs 21 and 22 in the differential amplification circuit 15 of FIG. 9. The first differential amplification circuit 61 amplifies the potential difference of the first and second input signals INA and INB to generate signals that complement each other.

The sources of the nMOS Trs 62a and 62b are connected to the second power supply V2. The gates of the nMOS Trs 62a and 62b are provided with the current control signal S1.

The drain of the nMOS Tr 62a is connected to a node (first output terminal of the first differential amplification circuit 61) between the resistor 64 and the nMOS Tr 24. The drain of the nMOS Tr 62b is connected to a node (second output terminal of the first differential amplification circuit 61) between the resistor 63 and the nMOS Tr 23.

The second functional block 12 includes the level shift circuit 35 of the second embodiment (refer to FIG. 11). In other words, the nMOS Trs 36a and 36b configuring the level shift circuit 35 respectively receive complementary signals output from the first differential amplification circuit 61.

Figure 15:
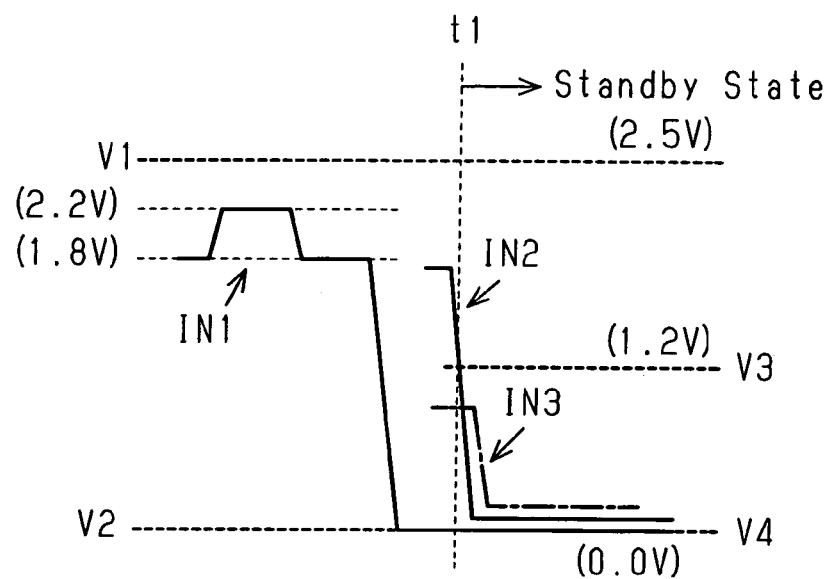
FIG. 15 is a waveform diagram showing the operation of the input circuit of FIG. 14 when switching between an activated state and a standby state.

FIG. 15 is a waveform diagram showing the operation of the input circuit 60 when switching between an activated state and a standby state. The voltages of the first to fourth power supplies V1 to V4 and the voltage of the first functional block input signal IN1 (external input signal) are the same as in FIG. 10. The first functional block input signal IN1 (external input signal) stops when entering the standby state (signal voltage going low; second power supply V2, 0.0 V).

When the first functional block input signal IN1 goes low (0.0 V), or when the first and second input signals INA and INB go low, the nMOS Trs 23 and 24 of the first differential amplification circuit 61 are inactivated.

Then, when the current control signal S1 goes high at time t1, the pMOS Tr 14 is inactivated to enter the standby state. The high current control signal S1 activates the nMOS Trs 62a and 62b.

When the input circuit 60 enters the standby state, the output voltage of the first differential amplification circuit 61 (the voltage at a node between the resistor 64 and the nMOS Tr 24 and the voltage at a node between the resistor 63 and the nMOS Tr 23) is discharged to the ground potential through the nMOS Trs 62a and 62b. This quickly decreases the voltage of the second functional block input signal IN2 to a value close to the voltage of the second power supply V2 (0.0 V). Accordingly, the nMOS Trs 36a and 36b are immediately inactivated. Further, the output voltage of the level shift circuit 35 (the voltage at a node between the nMOS Trs 36a and 37a and the voltage at a node between the nMOS Trs 36b and 37b) is discharged to the ground potential through the nMOS Trs 37a and 37b. Accordingly, the voltage of the third functional block input signal IN3 is quickly decreased to a value close to the voltage of the second power supply V2 (0.0 V).

As described above, in the fifth embodiment, if the first functional block input signal IN1 (external input signal) is stopped when switching to the standby state, the nMOS Trs 23 and 24 are inactivated. This prevents the voltage of the second functional block input signal IN2 from becoming temporarily high.

Accordingly, in the fifth embodiment, when the input circuit 60 is switched to the standby state, the voltage of the third functional block input signal IN3 is prevented from becoming temporarily high regardless of the first functional block input signal IN1. This prevents voltage exceeding the gate withstand voltage from being applied to the second differential amplification circuit 17.

In the fifth embodiment, instead of the voltage of the first power supply V1, a signal having a reversed phase to that of the current control signal S1 may be provided to the gate of the nMOS Tr 25 of the first differential amplification circuit 61. That is, if the first functional block input signal IN1 (external input signal) is stopped, the nMOS Tr 25 (first current source) may be inactivated together with the pMOS Tr 14 (first current control circuit).

Figure 16:
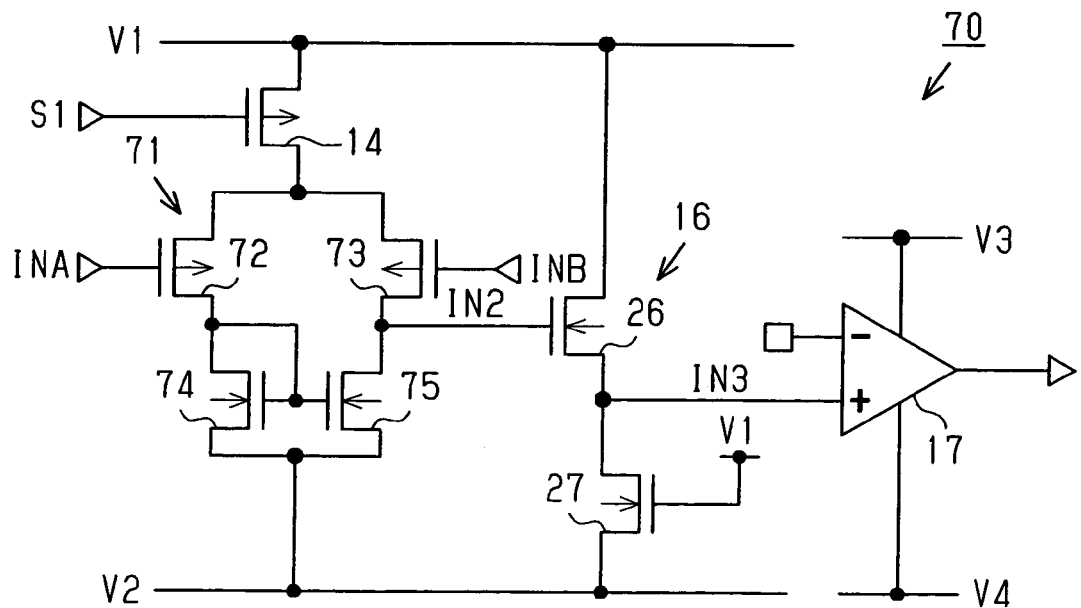
FIG. 16 is a schematic circuit diagram of an input circuit according to a sixth embodiment of the present invention.

FIG. 16 is a schematic circuit diagram of an input circuit 70 according to a sixth embodiment of the present invention. In the input circuit 70, the configuration of the first functional block 11 in the input circuit 10 of the first embodiment (refer to FIG. 8) is changed.

The first functional block 11 includes a pMOS Tr 14 (first current control circuit) and a first differential amplification circuit 71.

The first differential amplification circuit 71 includes pMOS Trs 72 and 73, which receive the first and second input signals INA and INB, and nMOS Trs 74 and 75, which configure a current mirror circuit. In the first differential amplification circuit 71, the first current source is shared with the pMOS Tr 14. The first differential amplification circuit 71, which is configured in this manner, is optimal when amplifying an input signal that is close to the ground potential.

Figure 17:
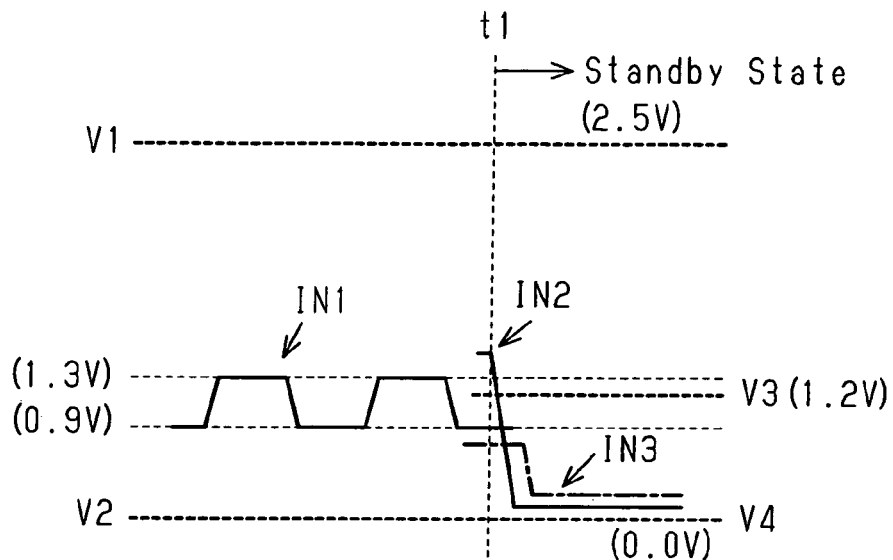
FIG. 17 is a waveform diagram showing the operation of the input circuit of FIG. 16 when switching between an activated state and a standby state.

FIG. 17 is a waveform diagram showing the operation of the input circuit 70 when switching between an activated state and a standby state. The voltages of the first to fourth power supplies V1 to V4 are the same as in FIG. 10, and the voltage of the first functional block input signal IN1 (external input signal) is 1.3 V/0.9 V.

As shown in FIG. 17, when the input circuit 70 is switched to the standby state, the voltages of the second and third functional input signals IN2 and IN3 are quickly decreased to a value close to the voltage of the second power supply V2 (0.0 V). Accordingly, the input circuit 70 has the same advantages as the first embodiment. In addition, in the sixth embodiment, the pMOS Trs 72 and 73 receive the first and second input signals INA and INB. This enables the first current source to be shared with the pMOS Tr 14 (first current control circuit) in the first differential amplification circuit 71.

Figure 18:
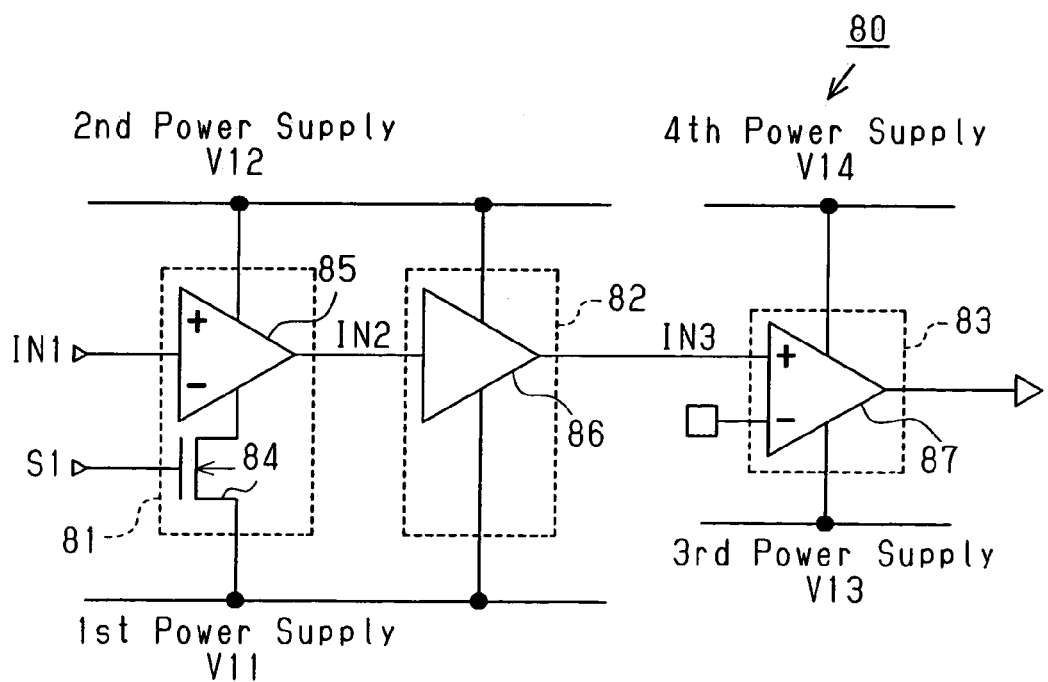
FIG. 18 is a circuit diagram showing the principles of an input circuit according to a seventh embodiment of the present invention.

FIG. 18 is a circuit diagram showing the principles of an input circuit 80 according to a seventh embodiment of the present invention.

The seventh embodiment is a specific example of a case in which the power supply supplies power having a negative potential. The input circuit 80 of the seventh embodiment is configured by transistors having a conductivity type that differs from that of the input circuit 10 of the first embodiment (refer to FIGS. 8 and 9).

The input circuit 80 is connected to first to fourth power supplies V11 to V14. The second and fourth power supplies V12 and V14 are ground power supplies, and the first and third power supplies V11 and V13 are negative power supplies.

The first power supply V11 corresponds to an external power supply, and the third power supply V3 corresponds to an internal power supply. The absolute value of the potential at the third power supply V13 is lower than that at the first power supply V11 (|first power supply—second power supply|>|third power supply—fourth power supply|).

The input circuit 80 includes first and second functional blocks 81 and 82, which are connected between the first power supply V11 and the second power supply V12, and a third functional block 83, which is connected between the third power supply V13 and the fourth power supply V14.

The first functional block 81 includes an nMOS Tr 84 (first current control circuit) and a first differential amplification circuit 85. The first differential amplification circuit 85 amplifies the potential difference in the first functional block input signal IN1 to generate the second functional block input signal IN2.

The second functional block 82 includes a level shift circuit 86. The level shift circuit 86 shifts the voltage of the second functional block input signal IN2 to a voltage adapted to the third power supply V13 (internal power supply) to generate a third functional block input signal IN3.

The third functional block 83 includes a second differential amplification circuit 87. The second differential amplification circuit 87 amplifies the potential difference in a third functional block input signal IN3 and provides the amplified signal to an internal circuit (not shown).

Figure 19:
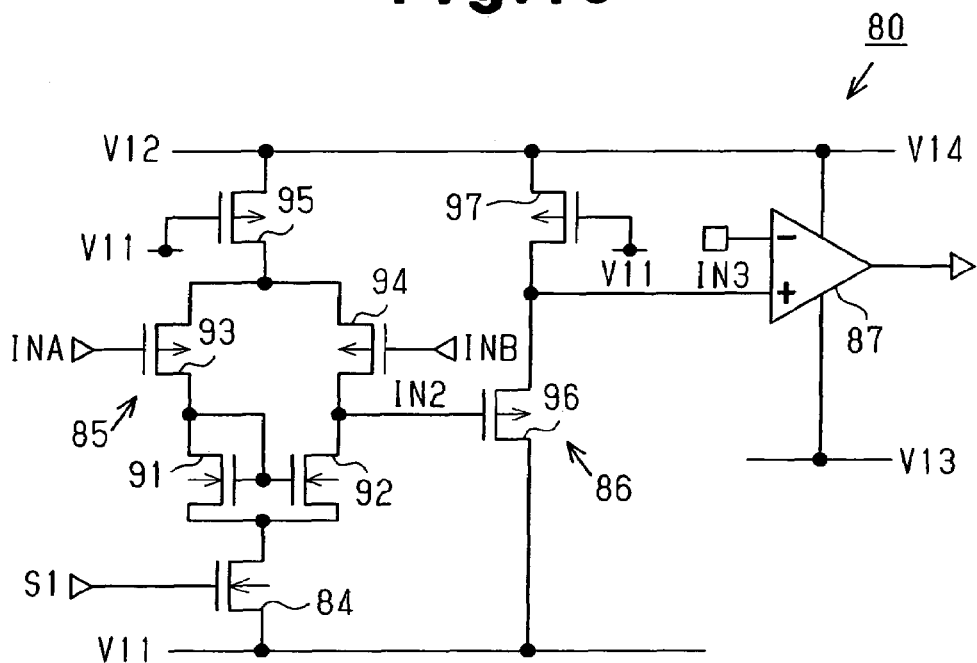
FIG. 19 is a schematic circuit diagram of the input circuit of the seventh embodiment.

FIG. 19 is a circuit diagram showing the input circuit 80 in detail.

The first differential amplification circuit 85 includes nMOS Trs 91 and 92, which configure a current mirror circuit functioning (first load circuit), pMOS Trs 93 and 94, which are respectively connected in series to the nMOS Trs 91 and 92, and a pMOS Tr 95 (first current source).

The nMOS Tr 84 (first current control circuit) has a source connected to the first power supply V11 and a drain connected to the sources of the nMOS Trs 91 and 92. The gate of the nMOS Tr 84 is provided with a current control signal S1, which controls the activation and inactivation of the nMOS Tr84.

The gates of the nMOS Trs 91 and 92 are connected to each other and to the drain of the nMOS Tr 91. The drains of the nMOS Trs 91 and 92 are respectively connected to the drains of the pMOS Trs 93 and 94.

The sources of the pMOS Trs 93 and 94 are connected to the drain of the pMOS Tr 95, and the source of the pMOS Tr 95 is connected to the second power supply V12. The gate of the pMOS Tr 95 is supplied with voltage of the first power supply V11 that is less than or equal to the threshold value of the pMOS Tr 95 (voltage enabling activation of the pMOS Tr 95).

The first and second input signals INA and INB are applied to the gates of the pMOS Trs 93 and 94. In the seventh embodiment, the first and second input signals INA and INB complement each other (have reversed phases).

When the current control signal S1 activates the nMOS Tr 84, the first differential amplification circuit 85 amplifies the potential difference of the first and second input signals INA and INB to generate a second functional block input signal IN2.

The level shift circuit 86 includes a pMOS Tr 96 (level shift transistor) and a pMOS Tr 97 (second current source).

The pMOS Tr 96 has a drain connected to the first power supply V11 and a gate provided with the second functional block input signal IN2. The source of the pMOS Tr 96 is connected to the drain of the pMOS Tr 97, and the source of the pMOS Tr 97 is connected to the second power supply V12. The gate of the pMOS Tr 97 is supplied with voltage of the first power supply V11 that is less than or equal to the threshold value of the pMOS Tr 97 (voltage enabling activation of the pMOS Tr 97).

The level shift circuit 86 shifts the voltage of the second functional block input signal IN2 to a range between the voltages of the third power supply V13 and the fourth power supply V14 (ground power supply) to generate a third functional block input signal IN3. In other words, the pMOS Trs 96 and 97 of the level shift circuit 86 have the capacity to shift the voltage of the second block input signal IN2 to a voltage that adapts to the third power supply V13.

The second differential amplification circuit 87, which is configured in the same manner as the first differential amplification circuit 85, amplifies the potential difference in the third functional block input signal IN3 and provides the amplified signal to an internal circuit. In the seventh embodiment, the output signal of the level shift circuit 86 is provided to the positive input terminal of the second differential amplification circuit 87. Further, a constant voltage signal having a median potential of the voltage amplitude of the output signal is provided to the negative input terminal of the second differential amplification circuit 87.

The third power supply V13 supplies the second differential amplification circuit 87 with voltage lower than that of the first power supply V11. Thus, the gate oxidized film of the transistor in the second differential amplification circuit 87 is thinner than the gate oxidized film of the transistor in the first differential amplification circuit 85 or the level shift circuit 86. In other words, the transistor in the second differential amplification circuit 87 has a gate oxidized film with a thickness corresponding to the voltage of the third power supply V13. Thus, the transistor in the second differential amplification circuit 87 has a gate withstand voltage (device withstand voltage) that is lower than that of the transistors in the first differential amplification circuit 85 and the level shift circuit 86.

When the current control signal S1 goes high and activates the nMOS Tr 84 of the first functional block 81 (refer to FIG. 18), the input circuit 80 is activated. In the seventh embodiment, the operation of the input circuit 80 in an activated state is the same as the operation of the prior art input circuit 170 in an activated state and will this not be discussed below.

The operation of the input circuit 80 when switched from an activated state to a standby state will now be discussed.

When the current control signal S1 goes low and inactivates the nMOS Tr 84, the input circuit 80 enters a standby state (i.e., the input circuit 80 controls the value of the current flowing through the nMOS Tr 84 to be 0).

Figure 20:
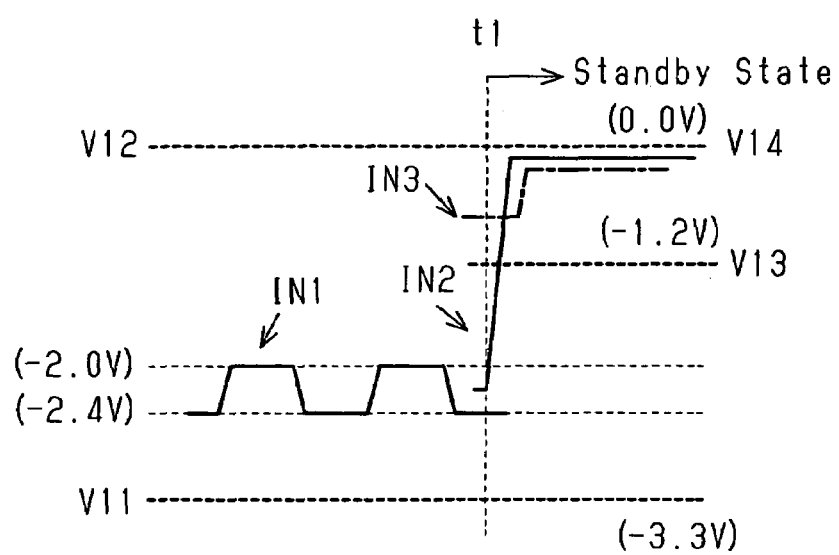
FIG. 20 is a waveform diagram showing the operation of the input circuit of FIG. 19 when switching between an activated state and a standby state.

FIG. 20 is a waveform diagram showing the operation of the input circuit 80 when switched between an activated state and a standby state. The first power supply V11 is set at −3.3 V, the second power supply V12 is set at 0.0 V, the third power supply V3 is set at −1.2 V, the fourth power supply V14 is set at 0.0 V, and the voltage of the first functional block input signal IN1 (external input signal) is set at −2.4 V/−2.0 V.

At time t1, the current control signal S1 goes low and inactivates the nMOS Tr 84 to enter the standby state. In this state, the output voltage of the first differential amplification circuit 85 (the node voltage between the nMOS Tr 92 and the pMOS Tr94) is charged by the second power supply V12 via the pMOS Tr 95, which functions as the first current source, and the pMOS Tr 94. Thus, the voltage of the second functional block input signal IN2 is quickly increased to a value close to the voltage of the second power supply V12 (0.0 V). Accordingly, the pMOS Tr 96 of the level shift circuit 86 is immediately inactivated, and the output voltage of the level shift circuit 86 (node voltage between the pMOS Trs 96 and 97) is charged by the second power supply V12 via the pMOS Tr 97, which functions as the second current source. Thus, the voltage of the third functional block input signal IN3 is quickly increased to a value close to the voltage of the second power supply V12 (0.0 V). This prevents voltage exceeding the transistor gate withstand voltage from being applied to the second differential amplification circuit 87 when switching to the standby state. In other words, the high voltage (in this case, the absolute value) of the first power supply V11 (−3.3 V) exceeding that of the third power supply V13 (−1.2 V) is not applied to the second differential amplification circuit 87.

The input circuit 80 of the seventh embodiment has the advantages described below.

(1) When the input circuit 80 is switched to the standby state, the output voltage of the first differential amplification circuit 85 is charged by the second power supply V12 (ground potential) via the pMOS Tr 95, which is the first current source. Further, the pMOS Tr 96 of the level shift circuit 86 is immediately inactivated. The output voltage of the level shift circuit 86 is charged by the second power supply V12 (ground potential) via the pMOS Tr 97, which is the second current source. Thus, the voltage of the third functional block input signal IN3 is quickly increased to a value close to the voltage of the second power supply V12. This prevents the voltage of the first power supply V11 exceeding the device withstand voltage (in this case, absolute value) from being applied to the first power supply V11. Accordingly, the reliability of the input circuit 80 is improved.

(2) The gate of the pMOS Tr 95 (first current source) in the first differential amplification circuit 85 and the gate of the pMOS Tr 96 (second current source) in the level shift circuit 86 are connected to the first power supply V11. Accordingly, in the standby state, each current source is not disconnected (the pMOS Trs 95 and 96 are not inactivated). As a result, the output terminals of the first differential amplification circuit 85 and the level shift circuit 86 do not enter a high impedance state (also referred to as a floating state).

(3) Regardless of whether the input circuit 10 is in an activated state, a standby state, or in a state switching between the activated and standby states, a high voltage (in this case, absolute value) exceeding the gate withstand voltage is prevented from being supplied to the second differential amplification circuit 87.

(4) When the input circuit 80 is switched to the standby state, timings do not have to be adjusted so that high voltage (absolute value) is not applied to the second differential amplification circuit 87. In other words, the nMOS Tr 84 of the first functional block 81 is inactivated to immediately switch the input circuit 80 to a standby state. Accordingly, the switching to the standby state is performed at a high speed, and the return to the activated state thereafter is also performed at a high speed.

(5) The nMOS Tr84 of the first functional block 81 is inactivated to reduce the current consumed by the first and second functional blocks 81 and 82 in the standby state. Accordingly, power consumption is reduced.

Figure 21:
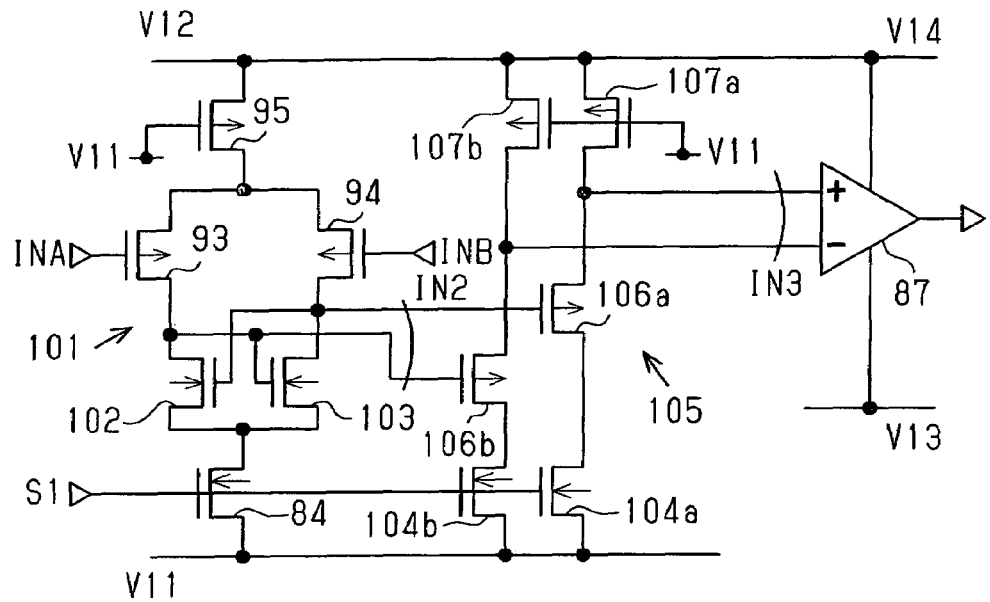
FIG. 21 is a schematic circuit diagram of an input circuit according to an eighth embodiment of the present invention.

FIG. 21 is a schematic circuit diagram of an input circuit 100 according to an eighth embodiment of the present invention.

Since the power supply is a negative potential power supply, the input circuit 100 of the eighth embodiment is configured by conductive transistors that differ from the transistors of the input circuit 30 in the second embodiment (refer to FIG. 11).

The first functional block 81 includes an nMOS Tr 84 (first current control circuit) and a first differential amplification circuit 101. The first differential amplification circuit 101 includes nMOS Trs 102 and 103. The gates of the nMOS Trs 102 and 103 are connected to the drains of the other one of the nMOS Trs 102 and 103. That is, the nMOS Trs 91 and 92 in the current mirror circuit of the first differential amplification circuit 85 shown in FIG. 11 are changed to the nMOS Trs 102 and 103.

The first differential amplification circuit 101 amplifies the potential difference of the first and second input signals INA and INB to generate a signal at a node between the nMOS Tr 103 and the pMOS Tr 94 and a complementary signal at a node between the nMOS Tr 102 and the pMOS Tr 93.

The second functional block 82 includes nMOS Trs 104a and 104b, which function as a second current control circuit, and a level shift circuit 105. The level shift circuit 105 includes pMOS Trs 106a and 106b (level shift transistors), which have gates supplied with the output voltage of the first differential amplification circuit 101 (the second functional block input signal IN2), and pMOS Trs 107a and 107b (second current source), which have gates connected to the first power supply V11.

More specifically, the node voltage between the nMOS Tr 103 and the pMOS Tr 94 is applied to the gate of the pMOS Tr 106a. Further, the node voltage between the nMOS Tr 102 and the pMOS Tr 93 is applied to the gate of the pMOS Tr 106b.

In the input circuit 100 configured in this manner, complementary third functional block input signals IN3 signals are provided to the second differential amplification circuit 87. The input circuit 100 is activated when the current control signal S1 activates the nMOS Trs 84, 104a, and 104b and enters the standby state when the nMOS Trs 84, 104a, and 104b are inactivated. In the activated state, the level shift circuit 105 supplies the second differential amplification circuit 87 with the third functional block input signal IN3, the voltage of which has been shifted to adapt to the third power supply V13.

When switching the input circuit 100 from the activated state to the standby state, the output voltage of the level shift circuit 105 (the node voltage between the pMOS Trs 106a and 107a and the node voltage between the pMOS Trs 106b and 107b) are charged by the second power supply V12 through the pMOS Trs 107a and 107b. Thus, the voltage of the third functional block input signal IN3 is quickly increased to a value close to the voltage of the second power supply V12 (ground potential) when the input circuit 100 is switched to the standby state (FIG. 20).

Accordingly, the input circuit 100 has the same advantages as the seventh embodiment. In addition, the second functional block 82 includes the nMOS Trs 104a and 104b (second current control circuit). This further decreases current leakage in the block 82.

Figure 22:
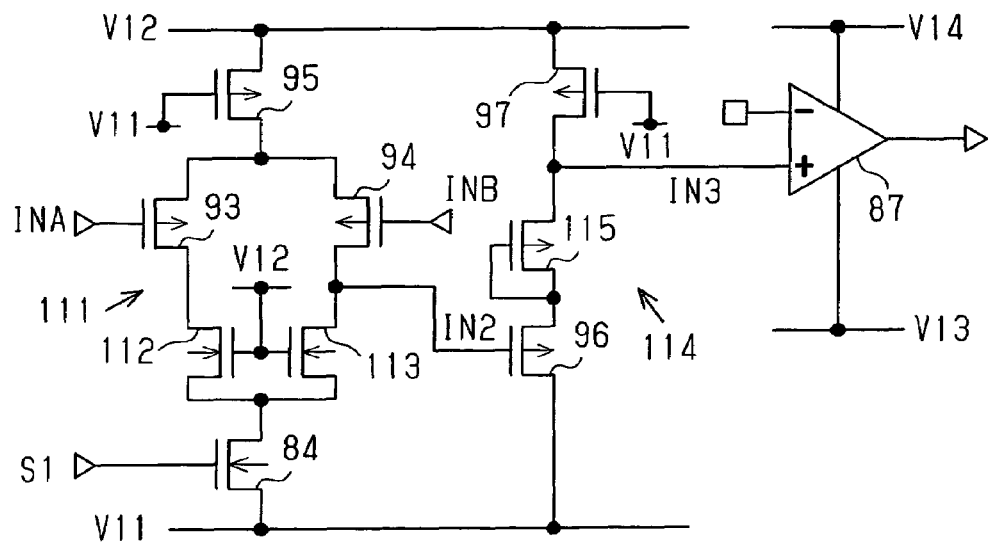
FIG. 22 is a schematic circuit diagram of an input circuit according to a ninth embodiment of the present invention.

FIG. 22 is a schematic circuit diagram of an input circuit 110 according to a ninth embodiment of the present invention.

The input circuit 110 of the ninth embodiment is configured by conductive transistors that differ from those of the input circuit 40 of the third embodiment (refer to FIG. 12) to correspond to a negative potential power supply.

The first functional block 81 includes an nMOS Tr 84 (first current control circuit) and a first differential amplification circuit 111.

The first differential amplification circuit 111 includes nMOS Trs 112 and 113. The second power supply V12 supplies the gates of the nMOS Trs 112 and 113 with voltage that is greater than or equal to the threshold value. That is, the nMOS Trs 91 and 92 in the current mirror circuit of the first differential amplification circuit 85 shown in the seventh embodiment of FIG. 19 are changed to the nMOS Trs 112 and 113.

The second functional block 82 includes a level shift circuit 114. The level shift circuit 114 includes pMOS Trs 96 and 97 and a pMOS Tr 115, which functions as a second load circuit connected between the pMOS Trs 96 and 97. The pMOS Tr 115 has a diode connection configuration. More specifically, the pMOS Tr115, which functions as a transistor that adjusts the level shift amount, decreases the output voltage of the level shift circuit 114 by an amount equal to the threshold voltage of the pMOS Tr 115. Thus, in the ninth embodiment, the voltage of the third functional block input signal IN3 is shifted to a voltage that is greater than in the seventh and eighth embodiments (toward the voltage of the second power supply V12).

The level shift amount may also be adjusted by increasing the ON resistance of the pMOS Tr 96 (level shift transistor). However, this would decrease the operation speed of the level shift circuit 114 and is thus not appropriate for increasing the operation speed.

In addition to the advantages of the seventh embodiment, the ninth embodiment prevents voltage (in this case, absolute voltage) exceeding the voltage of the third power supply V3 from being applied to the second differential amplification circuit 87 without decreasing the operation speed in the activated state.

Figure 23:
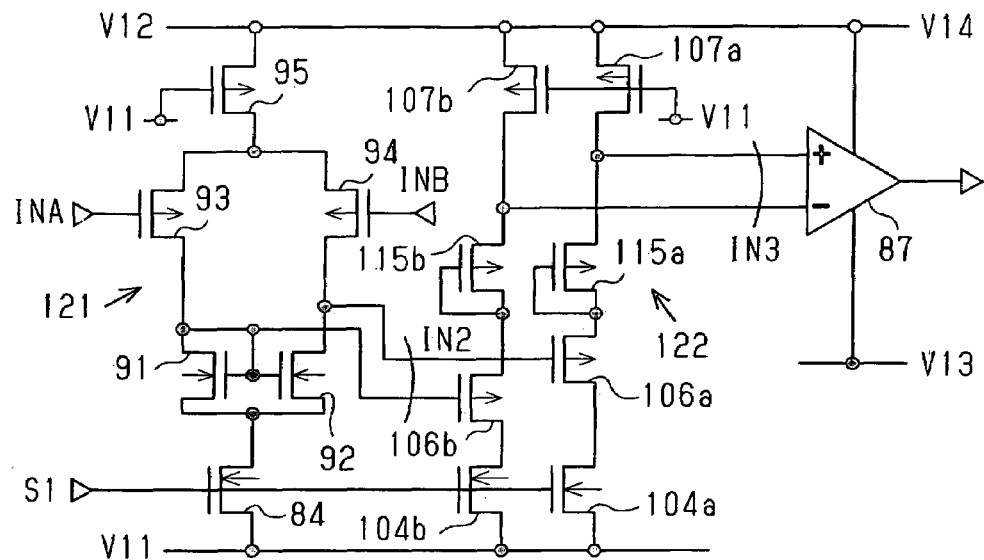
FIG. 23 is a schematic circuit diagram of an input circuit according to a tenth embodiment of the present invention.

FIG. 23 is a schematic circuit diagram of an input circuit 120 according to a tenth embodiment of the present invention. The input circuit 120 of the tenth embodiment is configured by conductive transistors that differ from those of the input circuit 50 of the fourth embodiment (refer to FIG. 13) to correspond to a negative potential power supply.

The first functional block 81 includes an nMOS Tr 84 (first current control circuit) and a first differential amplification circuit 121. The first differential amplification circuit 121 amplifies the potential difference of the first and second input signals INA and INB to generate a signal at a node between the nMOS Tr 92 and the pMOS Tr 94 and a complementary signal at a node between the nMOS Tr 91 and the pMOS Tr 93.

The second functional block 82 includes nMOS Trs 104a and 104b (second current control circuit) and a level shift circuit 122. The level shift circuit 122 is configured by adding pMOS Trs 115a and 115b (diode-connected transistor) as a second load circuit for adjusting the level shift amount in the same manner as in the third embodiment to the level shift circuit 105 of the ninth embodiment shown in FIG. 21.

In the input circuit 120, the second differential amplification circuit 87 is provided with complementary third functional block input signals IN3 in the same manner as in the eighth embodiment. The input circuit 120 that is configured in such manner has the advantages of the seventh to ninth embodiments.

Figure 24:
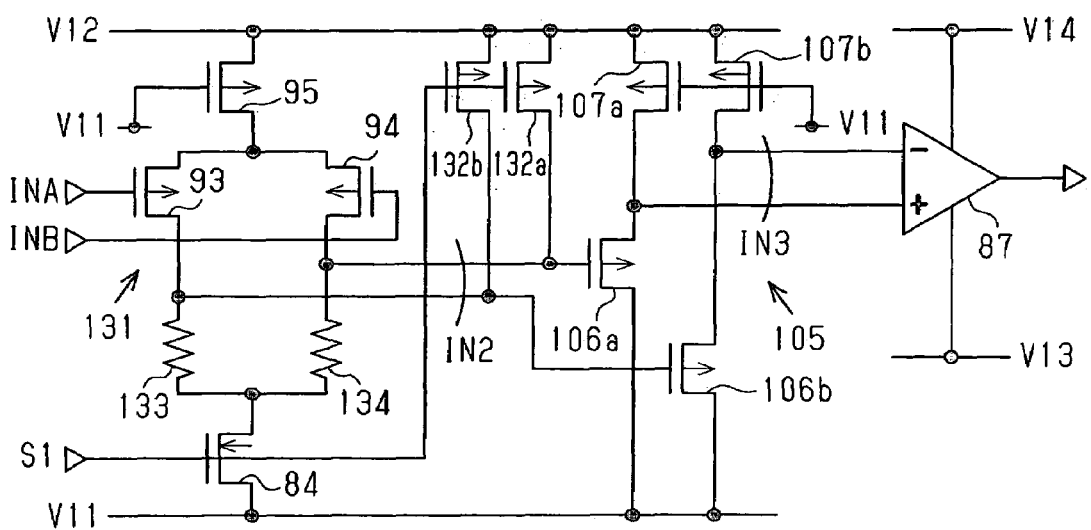
FIG. 24 is a schematic circuit diagram of an input circuit according to an eleventh embodiment of the present invention.

FIG. 24 is a schematic circuit diagram of an input circuit 130 according to an eleventh embodiment of the present invention.

The input circuit 130 of the eleventh embodiment is configured by transistors having a type of conductivity that differs from those of the input circuit 60 of the fifth embodiment (refer to FIG. 14) to correspond to a negative potential power supply.

The first functional block 81 includes an nMOS TR 84 (first current control circuit), a first differential amplification circuit 131, and pMOS Trs 132a and 132b, which function as a third current control circuit.

The first differential amplification circuit 131 includes resistors 133 and 134. The resistors 133 and 134 replace the nMOS Trs 91 and 92 in the differential amplification circuit 85 of the seventh embodiment shown in FIG. 19. The first differential amplification circuit 131 amplifies the potential difference of the first and second input signals INA and INB to generate signals that complement each other.

The sources of the pMOS Trs 132a and 132b (third current control circuit) are connected to the second power supply V12. The drain of the pMOS Tr 132a is connected to a node (first output terminal of the first differential amplification circuit 131) between the resistor 134 and the pMOS Tr 94. The drain of the pMOS Tr 132b is connected to a node (second output terminal of the first differential amplification circuit 131) between the resistor 133 and the pMOS Tr 93.

The second functional block 82 includes the level shift circuit 105 of the eighth embodiment (refer to FIG. 21). The pMOS Trs 106a and 106b of the level shift circuit 105 respectively receive complementary signals output from the first differential amplification circuit 131.

Figure 25:
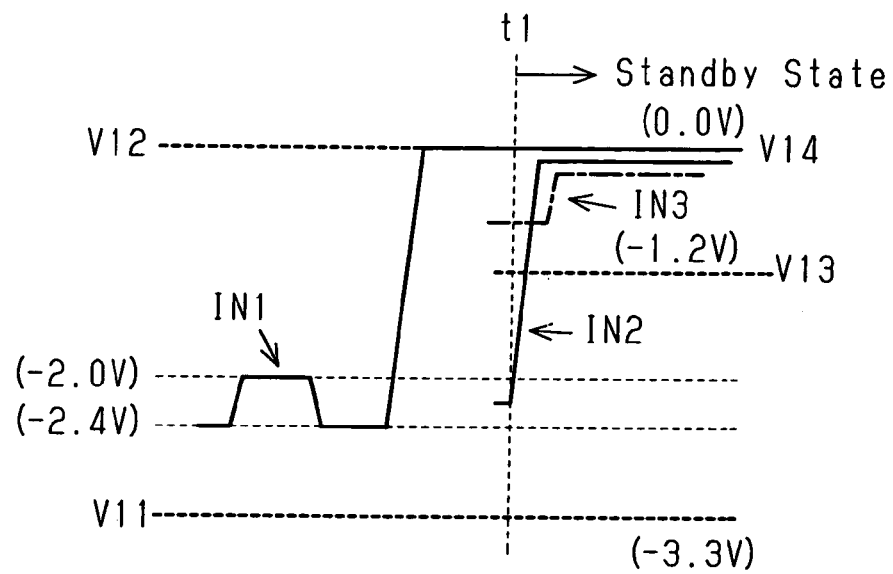
FIG. 25 is a waveform diagram showing the operation of the input circuit of FIG. 24 when switching between an activated state and a standby state.

FIG. 25 is a waveform diagram showing the operation of the input circuit 130 when switching between an activated state and a standby state. The voltages of the first to fourth power supplies V11 to V14 and the voltage of the first functional block input signal IN1 (external input signal) are the same as in FIG. 20. The first functional block input signal IN1 (external input signal) stops when entering the standby state (signal voltage going high; second power supply V12, 0.0 V).

When the first functional block input signal IN1 goes high (0.0 V), or when the first and second input signals INA and INB go high, the pMOS Trs 93 and 94 of the first differential amplification circuit 131 are inactivated.

Then, when the current control signal S1 goes low at time t1, the nMOS Tr 84 is inactivated to enter the standby state. The low current control signal S1 activates the pMOS Trs 132a and 132b.

When the input circuit 130 enters the standby state, the output voltage of the first differential amplification circuit 131 (the voltage at a node between the resistor 134 and the pMOS Tr 94 and the voltage at a node between the resistor 133 and the pMOS Tr 93) is charged by the second power supply V12 through the pMOS Trs 132a and 132b. This quickly increases the voltage of the second functional block input signal IN2 to a value close to the voltage of the second power supply V2 (0.0 V). Accordingly, the pMOS Trs 106a and 106b are immediately inactivated. Further, the output voltage of the level shift circuit 105 (the voltage at a node between the pMOS Trs 106a and 107a and the voltage at a node between the pMOS Trs 106b and 107b) is charged by the second power supply V12 through the pMOS Trs 107a and 107b. Accordingly, the voltage of the third functional block input signal IN3 is quickly increased to a value close to the voltage of the second power supply V12 (0.0 V).

As described above, in the eleventh embodiment, if the first functional block input signal IN1 (external input signal) is stopped when switching to the standby state, the pMOS Trs 93 and 94 are inactivated. This prevents the absolute value of the voltage of the second functional block input signal IN2 from becoming temporarily high. Accordingly, in the eleventh embodiment, when the input circuit 130 is switched to the standby state, the absolute value of the voltage of the third functional block input signal IN3 is prevented from becoming temporarily high regardless of the voltage of the first functional block input signal IN1. This prevents voltage exceeding the gate withstand voltage from being applied to the second differential amplification circuit 87.

In the eleventh embodiment, instead of the voltage of the first power supply V11, a signal having a reversed phase to that of the current control signal S1 may be provided to the gate of the pMOS Tr 95 of the first differential amplification circuit 131. That is, if the first functional block input signal IN1 (external input signal) is stopped, the pMOS Tr 95 (first current source) may be inactivated together with the nMOS Tr 84 (first current control circuit).

Figure 26:
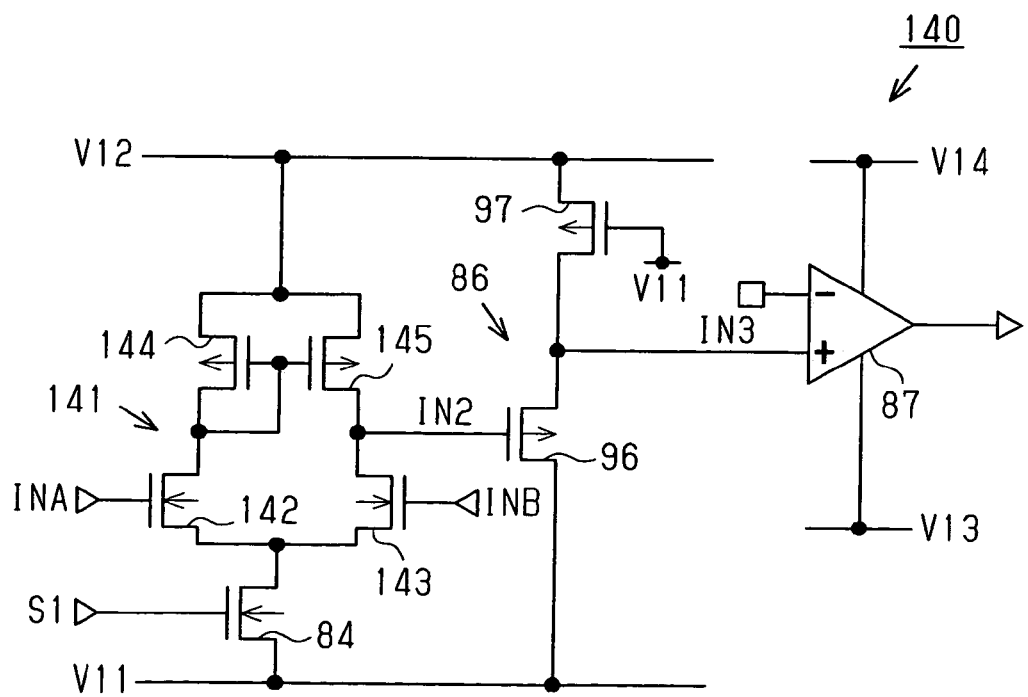
FIG. 26 is a schematic circuit diagram of an input circuit according to a twelfth embodiment of the present invention.

FIG. 26 is a schematic circuit diagram of an input circuit 140 according to a twelfth embodiment of the present invention.

The input circuit 140 of the twelfth embodiment is configured by transistors having a type of conductivity that differs from those of the input circuit 70 of the sixth embodiment (refer to FIG. 16) to correspond to a negative potential power supply.

The first functional block 81 includes an nMOS Tr 84 (first current control circuit) and a first differential amplification circuit 141.

The first differential amplification circuit 141 includes nMOS Trs 142 and 143, which receive the first and second input signals INA and INB, and pMOS Trs 144 and 145, which configure a current mirror circuit. In the first differential amplification circuit 141, the first current source is shared with the nMOS Tr 84. The first differential amplification circuit 141, which is configured in this manner, is optimal when amplifying an input signal that is close to the ground potential.

Figure 27:
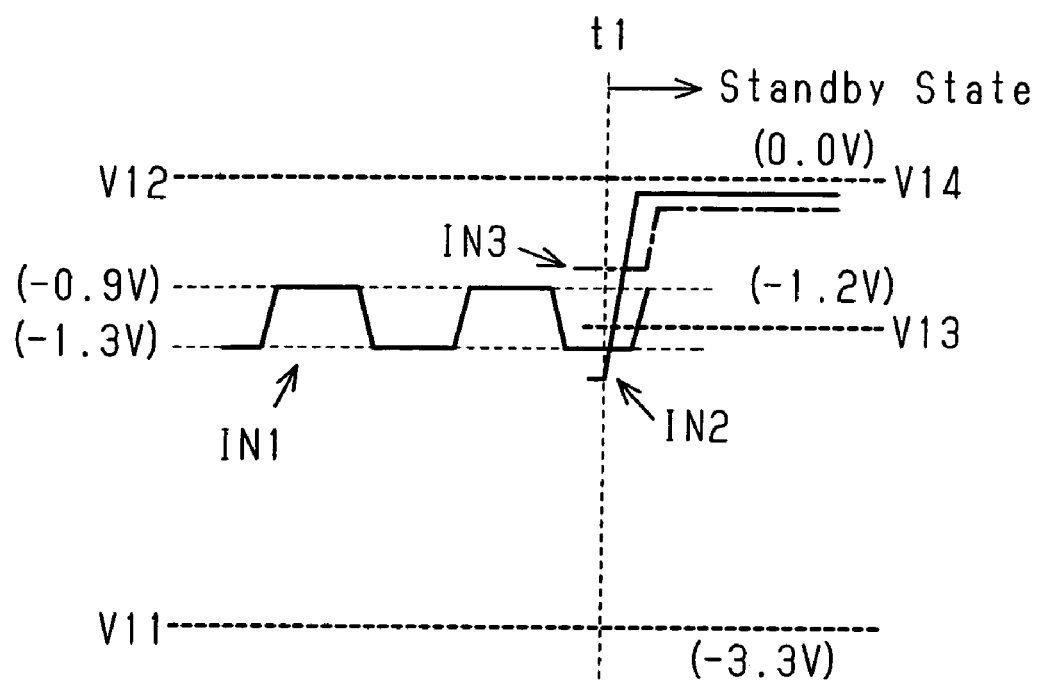
FIG. 27 is a waveform diagram showing the operation of the input circuit of FIG. 26 when switching between an activated state and a standby state.

FIG. 27 is a waveform diagram showing the operation of the input circuit 140 when switching between an activated state and a standby state. The voltages of the first to fourth power supplies V11 to V14 are the same as in FIG. 20, and the voltage of the first functional block input signal IN1 (external input signal) is −1.3 V/−0.9 V and close to the ground potential.

In the same manner as in the seventh embodiment, when the input circuit 140 is switched to the standby state, the voltages of the second and third functional input signals IN2 and IN3 are quickly increased to a value close to the voltage of the second power supply V2 (0.0 V). Accordingly, the input circuit 140 of the twelfth embodiment has the same advantages as the seventh embodiment. In addition, the nMOS Trs 142 and 143 receive the first and second input signals INA and INB. This enables the first current source to be shared with the nMOS Tr 84 in the first differential amplification circuit 141.

It should be apparent to those skilled in the art that the present invention may be embodied in many other specific forms without departing from the spirit or scope of the invention. Particularly, it should be understood that the present invention may be embodied in the following forms.

When the power supply is a positive power supply, the first to sixth embodiments may be combined as required to configure an input circuit. When the power supply is a negative power supply, the seventh to twelfth embodiments may be combined as required to configure an input circuit.

The present examples and embodiments are to be considered as illustrative and not restrictive, and the invention is not to be limited to the details given herein, but may be modified within the scope and equivalence of the appended claims.

What is claimed is:

1. An input circuit for receiving a first input signal and for use with a first power supply and a second power supply that supplies a voltage of absolute value less than an absolute value of the first power supply, the input circuit comprising:
    a first differential amplification circuit powered by the first power supply to receive and amplify the first input signal and generate a second input signal;
    a level shift circuit powered by the first power supply to shift voltage of the second input signal and generate a shifted input signal, the level shift circuit including an output terminal;
    a second differential amplification circuit powered by the second power supply to amplify the shifted input signal and generate an amplified signal; and
    a current control circuit connected between the first power supply and the first differential amplification circuit to selectively switch the input circuit between an activated state and a standby state,
    wherein the level shift circuit further includes a first circuit for charging or discharging voltage at the output terminal of the level shift circuit so that voltage of the shifted input signal is less than or equal to the absolute value of the voltage of the second power supply when switched to the standby state.

2. The input circuit according to claim 1, wherein the first circuit includes a constantly activated transistor.

3. The input circuit according to claim 1, wherein the first circuit includes a transistor having a gate connected to the first power supply.

4. The input circuit according to claim 3, wherein the first differential amplification circuit includes a second circuit for charging or discharging a voltage at an output terminal of the first differential amplification circuit when switching to the standby state.

5. The input circuit according to claim 4, wherein the second circuit includes a constantly activated transistor.

6. The input circuit according to claim 4, wherein the second circuit includes a transistor having a gate connected to the first power supply.

7. The input circuit according to claim 1, wherein the level shift circuit further includes:
    a level shift transistor having a drain connected to the first power supply and a gate for receiving the shifted input signal; and
    a load circuit connected between the level shift transistor and the first circuit to adjust a level shift amount.

8. An input circuit for receiving a first functional block input signal and for use with first, second, third, and fourth power supplies, wherein the second power supply supplies a voltage of absolute value less than an absolute value of the first power supply, and the fourth power supply supplies a voltage of absolute value less than an absolute value of the third power supply, the input circuit comprising:
    a first functional block including a first differential amplification circuit powered by the first power supply and the second power supply, the first differential amplification circuit receiving and amplifying the first functional block input signal to generate a second functional block input signal;
    a second functional block including a level shift circuit powered by the first power supply and the second power supply to shift voltage of the second functional block input signal and generate a third functional block input signal, the level shift circuit including an output terminal;
    a third functional block including a second differential amplification circuit powered by the third power supply and the fourth power supply, the second differential amplification circuit amplifying the third functional block input signal to generate an amplified signal; and
    a first current control circuit connected between the first power supply and the first differential amplification circuit to selectively switch the input circuit between an activated state and a standby state,
    wherein the level shift circuit further includes a first circuit for charging or discharging voltage at the output terminal of the level shift circuit so that voltage of the third functional block input signal is converged to a voltage between that of the third power supply and that of the fourth power supply.

9. The input circuit according to claim 8, wherein the absolute value of a potential difference between the first power supply and the second power supply is greater than the absolute value of a potential difference between the third power supply and the fourth power supply.

10. The input circuit according to claim 9, wherein each of the second and fourth power supplies is a ground power supply that charges or discharges the voltage at the output terminal of the level shift circuit when switching to the standby state.

11. The input circuit according to claim 8, further comprising an additional circuit for charging or discharging the voltage at an output terminal of the first differential amplification circuit when switching to the standby state.

12. The input circuit according to claim 8, wherein the first and second differential amplification circuits and the level shift circuit each includes a transistor having a gate oxidized film, wherein the gate oxidized film of the transistor in the second differential amplification circuit is thinner than the gate oxidized films of the transistors in the first differential amplification circuit and the level shift circuit.

13. The input circuit according to claim 8, wherein the first and second differential amplification circuits and the level shift circuit each includes a transistor, wherein a withstand voltage of the transistor in the second differential amplification circuit is lower than a withstand voltage of the transistors in the first differential amplification circuit and the level shift circuit.

14. The input circuit according to claim 8, wherein the first current control circuit includes a transistor having a gate for receiving a current control signal that cuts the supply of power from the first power supply to the first differential amplification circuit when switching to the standby state.

15. The input circuit according to claim 14, wherein the first differential amplification circuit includes: a first pair of transistors, each having a type of conductivity differing from that of the transistor in the first current control circuit and having a gate for receiving the first functional block input signal; a load circuit connected between the transistors of the first pair and the first current control circuit;
    and a first current source configured by a transistor having a type of conductivity that is the same as that of the first pair of transistors and connected between the transistors of the first pair and the second power supply, wherein the transistor of the first current source has a gate supplied with voltage that constantly activates the transistor.

16. The input circuit according to claim 15, wherein the load circuit includes a current mirror circuit comprising a second pair of transistors, each being a transistor having a type of conductivity differing from that of the first pair of transistors.

17. The input circuit according to claim 15, wherein the load circuit includes a second pair of transistors, each having a type of conductivity differing from that of the first pair of transistors and having a gate and a drain, the gates of the second pairs of transistors being connected to the drains of the other ones of the second pair of transistors.

18. The input circuit according to claim 15, wherein the load circuit includes a pair of transistors, each having a type of conductivity differing from that of the first pair of transistors and having a gate connected to the second power supply.

19. The input circuit according to claim 15, wherein the load circuit includes a pair of resistors, each being connected in series to one of the first pair of transistors.

20. The input circuit according to claim 14, wherein the first differential amplification circuit includes: a first pair of transistors, each having a type of conductivity that is the same as that of the transistor in the first current control circuit and having a gate for receiving the first functional block input signal; and a load circuit connected between the first pair of transistors and the second power supply.

21. The input circuit according to claim 20, wherein the first current control circuit functions as a current source of the first differential amplification circuit when the input circuit is in an activated state.

22. The input circuit according to claim 14, wherein the level shift circuit further includes:
a level shift transistor having a drain connected to the first power supply and a gate for receiving the second functional block input signal, wherein the first circuit includes a current source connected between the level shift transistor and the second power supply and the current source of the first circuit comprises:
a transistor having a type of conductivity that is the same as that of the level shift transistor, the transistor of the current source having a gate supplied with a voltage that constantly activates the transistor.

23. The input circuit according to claim 22, further comprising a second current control circuit connected between the level shift transistor and the first power supply, wherein the second current control circuit cuts the supply of power from the first power supply to the first level shift circuit when switching to the standby state.

24. The input circuit according to claim 23, wherein the second current control circuit includes a transistor having a type of conductivity that is the same as that of the transistor in the first current control circuit and of which is responsive to the current control signal.

25. The input circuit according to claim 22, further comprising a third current control circuit connected between the second power supply and a node between the first amplification circuit and the level shift circuit, wherein the third current control circuit charges or discharges voltage at an output terminal of the first differential amplification circuit when the first functional block input signal is not received.

26. The input circuit according to claim 25, wherein the first current control circuit includes a transistor, and the third current control circuit includes a transistor having a type of conductivity differing from that of the transistor of the first current control circuit, the transistor of the third current control circuit including a drain connected to the output terminal of the first differential amplification circuit and the gate of the level shift transistor, a source connected to the second power supply, and a gate for receiving the current control signal.

27. The input circuit according to claim 22, wherein the level shift circuit further includes a load circuit connected between the level shift transistor and the current source to adjust a level shift amount.

28. The input circuit according to claim 27, wherein the load circuit includes a diode-connected transistor.

* * * * *